(12) United States Patent
Nishimura et al.

(10) Patent No.: US 6,717,335 B2
(45) Date of Patent: Apr. 6, 2004

(54) COMPOSITE VIBRATION DEVICE

(75) Inventors: Toshio Nishimura, Shiga-ken (JP); Jiro Inoue, Omihachiman (JP); Hiroaki Kaida, Moriyama (JP); Akihiro Mitani, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 287 days.

(21) Appl. No.: 09/993,963

(22) Filed: Nov. 27, 2001

(65) Prior Publication Data

US 2004/0012306 A1 Jan. 22, 2004

(30) Foreign Application Priority Data

Nov. 27, 2000 (JP) .................................. 2000-359816
Nov. 27, 2000 (JP) .................................. 2000-359888
Nov. 15, 2001 (JP) .................................. 2001-350130

(51) Int. Cl.⁷ ............................................. H01L 41/04
(52) U.S. Cl. ..................................................... 310/364
(58) Field of Search .............................. 310/364, 313 D, 310/313 B, 335, 366, 328, 340; 333/186, 189, 195; H01L 41/04, 41/083, 41/047; H03H 9/54

(56) References Cited

U.S. PATENT DOCUMENTS

| | | | | |
|---|---|---|---|---|
| 4,223,286 A | * | 9/1980 | Ono et al. .................. 333/195 |
| 4,383,194 A | * | 5/1983 | Ohigashi et al. ............. 310/326 |
| 4,771,205 A | * | 9/1988 | Mequio ...................... 310/334 |
| 5,422,533 A | * | 6/1995 | Kosinski et al. ............. 310/335 |
| 5,548,179 A | * | 8/1996 | Kaida ......................... 310/367 |
| 5,757,106 A | * | 5/1998 | Sato et al. .................. 310/359 |
| 5,821,833 A | * | 10/1998 | Lakin ......................... 333/187 |
| 5,872,493 A | * | 2/1999 | Ella ........................... 333/191 |
| 6,091,180 A | * | 7/2000 | Unami et al. ................ 310/328 |
| 6,466,106 B1 | * | 10/2002 | Gamo ......................... 333/189 |
| 6,608,428 B2 | * | 8/2003 | Nishimura et al. ........... 310/366 |

FOREIGN PATENT DOCUMENTS

JP        10-270979    10/1998  ........... H01L/41/04

\* cited by examiner

Primary Examiner—Thomas M. Dougherty
Assistant Examiner—Karen Addison
(74) Attorney, Agent, or Firm—Keating & Bennett, LLP

(57) ABSTRACT

A composite vibration device includes a piezoelectric element defining a vibrating member, which is made of a material having a first acoustical impedance, first and second reflecting layers are connected to respective end surfaces of the piezoelectric element, each of the layers are made of a material having a second acoustical impedance lower than the first acoustical impedance, and first and second supporting members. Each of the first and second supporting members is made of a material having an acoustical impedance higher than the second acoustical impedance and is connected to the outer surface of each of the first and second reflecting layers. Vibrations propagated from the piezoelectric element are reflected at the interfaces between the reflecting layers and the supporting members.

38 Claims, 31 Drawing Sheets

COMPOSITE VIBRATION DEVICE

BACKGROUND OF THE INVENTION

1. Field of the Invention

The present invention relates to composite vibration devices that support a variety of vibrating members, with little influence on the vibration characteristics of the vibrating members. More particularly, the present invention relates to composite vibration devices, in which piezoelectric elements, electrostrictive elements, or other suitable elements are used as vibrating members.

2. Description of the Related Art

Conventionally, piezoelectric vibrating components have been widely used in resonators, filters, and other electronic components. For example, piezoelectric resonators use various vibration modes to obtain target resonant frequencies. As these vibrating modes, a thickness longitudinal vibration, a thickness-shear vibration, a length vibration, a width vibration, an extension vibration, a bending vibration, and other modes are known.

In such piezoelectric resonators, the supporting structures thereof vary with the type of vibration modes. Energy-trap piezoelectric resonators using a thickness longitudinal vibration and a thickness-shear vibration can be mechanically supported at both ends thereof. FIG. 34 shows an example of an energy-trap piezoelectric resonator using a thickness-shear vibration. In a piezoelectric resonator 201, a resonant electrode 203 is provided on the top surface of a piezoelectric plate 202 having a strip-like configuration and a resonant electrode 204 is provided on the bottom surface thereof and is disposed opposite to the resonant electrode 203. The resonant electrodes 203 and 204 are opposed to each other at the approximate center in the lengthwise direction of the piezoelectric strip 202. The opposing portion thereof defines an energy-trap piezoelectric vibrating section. As a result, vibration is trapped in the piezoelectric vibrating section. Thus, the piezoelectric resonator 201 can be mechanically supported at its ends without influencing the vibration of the piezoelectric vibrating section.

In the energy-trap piezoelectric resonator 201, however, although vibrating energy is trapped in the piezoelectric vibrating section, a vibration attenuating section requiring a relatively large space must be provided outside the piezoelectric vibrating section. Consequently, for example, the length of the piezoelectric resonator strip 201 using a thickness-shear mode must be increased.

On the other hand, in piezoelectric resonators using a length vibration, a width vibration, an extension vibration, and a bending vibration, it is not possible to produce an energy-trap piezoelectric vibrating section. Thus, in order to prevent any influence on the resonant characteristics, a metal spring terminal is utilized to allow the terminal to be in contact with a node of vibration of the piezoelectric resonator. This arrangement permits the formation of a supporting structure.

In Japanese Unexamined Patent Application Publication No. 10-270979, a bulk acoustic wave filter 211 is provided as shown in FIG. 35. In the bulk acoustic wave filter 211, a plurality of films is stacked on a substrate 212. In other words, a piezoelectric layer 213 is provided in the multi-layered structure. On the top and bottom of the piezoelectric layer 213, stacked electrodes 214 and 215 are provided to define a piezoelectric resonator. In addition, on the bottom of the piezoelectric resonator, films made of silicon, polysilicon, or other suitable material are provided to define an acoustic mirror 219 having a multi-layered structure composed of a top layer 216, a middle layer 217, and a bottom layer 218. In this case, the acoustical impedance of the middle layer 217 is higher than the acoustical impedances of the top layer 216 and the bottom layer 218. The acoustic mirror 219 blocks the propagation of vibration produced by the piezoelectric resonator to the substrate 212.

In addition, an acoustic mirror 220 having the same structure is stacked on the upper portion of the piezoelectric resonator. A passivation film 221 is provided on the acoustic mirror 220. The passivation film 221 is made of a protective material such as epoxy, $SiO_2$, or other suitable material.

In such a conventional energy-trap piezoelectric resonator, a vibration attenuating section must be provided on the outside of the piezoelectric vibrating section. Thus, although the resonator can be mechanically supported with an adhesive, the size of the piezoelectric resonator 201 is increased.

Furthermore, non-energy-trap piezoelectric resonators using a length vibration mode and an extension vibration mode do not need a vibration attenuating section. However, the resonant characteristics of the piezoelectric resonator deteriorate when the resonator is fixed and supported with an adhesive, solder, or other fixing material. As a result, since the resonator must be supported by a spring terminal, the supporting structure is complicated and requires many components.

As described above, in the bulk acoustic wave filter disclosed in Japanese Unexamined Patent Application Publication No. 10-270979, the plurality of films is stacked on the substrate 212 to define the piezoelectric resonator and the acoustic mirror 219 acoustically isolates the piezoelectric resonator from the substrate. Thus, the piezoelectric resonator is acoustically isolated and supported by the acoustic mirror 219 having the multi-layer structure on the substrate 212.

However, in the bulk acoustic wave filter 211, on the substrate 212, many layers must be stacked to form the multi-layer structure defining the bottom acoustic mirror 219, the piezoelectric resonator, and the piezoelectric filter, and also, many layers must be stacked to define the top acoustic mirror 220. Additionally, on the top portion of the filter, the passivation film 221 must be arranged. As a result, the structure of the filter is complicated, and the vibration mode of the piezoelectric resonator is restricted because the resonator is defined by the multi-layer structure.

As mentioned above, conventionally, when a vibration source such as a piezoelectric resonator is supported without deteriorating the vibration characteristics, there are restrictions on the vibration mode of the resonator, the component size increases, and the structure is complicated.

SUMMARY OF THE INVENTION

To overcome the above-described problems, preferred embodiments of the present invention provide a composite vibration device that is supported by a relatively simple structure using a vibrating member producing a variety of vibration modes, with little or no influence on the vibration characteristics of the vibrating member.

According to a first preferred embodiment of the present invention, a composite vibration device includes a vibrating member as a vibration producing source, the vibrating member being made of a material having a first acoustical impedance $Z_1$, first and second reflecting layers connected to respective sides of the vibrating member, each of the layers being made of a material having a second acoustical impedance $Z_2$ which is lower than the first acoustical impedance $Z_1$, and supporting members, each of which is made of a material having a third acoustical impedance $Z_3$ which is higher than the second acoustical impedance $Z_2$, the supporting members being connected to sides of the reflecting layers opposing the sides thereof connected to the vibrating member, In this composite vibration device, vibrations propagated from the vibrating member to the reflecting layers are reflected at the interfaces between the reflecting layers and the supporting members.

According to another aspect of the present invention, a composite vibration device includes a vibrating member as a vibration producing source, the vibrating member being made of a material having a first acoustical impedance $Z_1$, a reflecting layer connected to a side of the vibrating member, the reflecting layer being made of a material having a second acoustical empedance $Z_2$ which is lower than the first acoustical impedance $Z_1$ and a supporting member, the s upporting member being made of a material having a third acoustical impedance $Z_3$ which is higher than the second acoustical impedance $Z_2$, the supporting member being connected to the side of the reflecting layer opposing the side there of connected to the vibrating member. In this composite vibration device, the vibration propagated from the vibrating member to the reflecting layer is reflected at the interface between the reflecting layer and the supporting member.

The ratio $Z_2/Z_1$ of the second acoustical impedance $Z_2$ with respect to the first acoustical impedance $Z_1$ is preferably about 0.2 or less, and more preferably about 0.1 or less.

In addition, the ratio $Z_2/Z_3$ of the second acoustical impedance $Z_2$ with respect to the third acoustical impedance $Z_3$ is preferably about 0.2 or less, and more preferably about 0.1 or less.

Further, the vibrating member is preferably defined by an electromechanical coupling conversion element. Also, the electromechanical coupling conversion element is defined by a piezoelectric element or an electrostrictive element.

The composite vibration device of the present preferred embodiment of the invention may also preferably include a third reflecting layer, a second vibrating member, a fourth reflecting layer, and a third supporting member, which are connected, in this order, to a side of at least one of the first and second supporting members opposing the side thereof connected to at least one of the first and second reflecting layers.

According to a second preferred embodiment of the invention, a composite vibration device includes first and second vibrating members defining vibration producing sources, each of the vibrating members being made of a material having a first acoustical impedance $Z_1$, first to third reflecting layers, each of which is made of a material having a second acoustical impedance $Z_2$ which is lower than the first acoustical impedance $Z_1$, and first and second supporting members, each of which is made of a material having a third acoustical impedance $Z_3$ which is higher than the second acoustical impedance $Z_2$. In this composite vibration device, the first supporting member, the first reflecting layer, the first vibrating member, the second reflecting layer, the second vibrating member, the third reflecting layer, and the second supporting member are connected in this order, and vibrations produced by the first and second vibrating members are reflected at the interface between the first reflecting layer and the first supporting member, at the interface between the third reflecting layer and the second supporting member, and at the interfaces between the second reflecting layer and the first and second vibrating members.

In addition, the reflecting layers may be formed by stacking a plurality of layers made of materials having different acoustical impedances.

In addition, when the wavelength of vibrations produced by only one vibrating member is represented by $\lambda$, the distances from the interfaces between the reflecting layers and the vibrating member to the interfaces between the reflecting layers and the supporting members are preferably in a range of $n\cdot\lambda/4\pm\lambda/8$, in which the symbol n represents an odd number.

In the composite vibration device according to preferred embodiments of the present invention, when the symbol A represents the direction of vibration displacement of the vibrating member, the symbol B represents the direction of vibrations propagating through the vibrating member, and the symbol C represents the direction of vibrations propagating through the reflecting layers, the directions A, B, and C may be combined in various manners. For example, the directions A, B, and C may be arranged substantially parallel to each other, or the direction A may be substantially parallel to the direction B, whereas the direction B may be substantially perpendicular to the direction C. In contrast, the direction A may be substantially perpendicular to the direction B, whereas the direction B may be substantially parallel to the direction C. Alternatively, the direction A may be substantially perpendicular to the direction B and also the direction B may be substantially perpendicular to the direction C.

According to a third preferred embodiment of the present invention, a composite vibration device includes a vibrating member defining a vibration producing source, the vibrating member being made of a material having a first acoustical impedance $Z_1$, first and second reflecting layers connected to each side of the vibrating member, each of the layers being made of a material having a second acoustical impedance $Z_2$ which is lower than the first acoustical impedance $Z_1$, and supporting members, each of which is made of a material having a third acoustical impedance $Z_3$ which is higher than the second acoustical impedance $Z_2$, the supporting members being connected to sides of the reflecting layers opposing the sides thereof connected to the vibrating member. In this composite vibration device, when the symbol $S_1$ represents the area of the surface of the vibrating member connected to each reflecting layer and the symbol $S_2$ represents the area of the surface of each reflecting layer connected to the vibrating member, the area ratio $S_2/S_1$ is preferably about 1 or less, and vibrations propagated from the vibrating member to each reflecting layer are reflected at the interfaces between the reflecting layers and the supporting members.

The ratio $Z_2/Z_1$ of the second acoustical impedance $Z_2$ with respect to the first acoustical impedance $Z_1$ is preferably about 0.2 or less, and more preferably about 1.0 or less.

Further, the ratio $Z_2/Z_3$ of the second acoustical impedance $Z_2$ with respect to the third acoustical impedance $Z_3$ is preferably about 0.2 or less, and more preferably about 0.1 or less.

In addition, the vibrating member is preferably defined by an electromechanical coupling conversion element. Furthermore, the electromechanical coupling conversion element is preferably defined by a piezoelectric element or an electrostrictive element.

Additionally, the composite vibration device also may preferably include a third reflecting layer, a second vibrating member, a fourth reflecting layer, and a third supporting member, which are connected, in this order, to a side of at least one of the first and second supporting members opposing the side thereof connected to at least one of the first and second reflecting layers.

According to a fourth preferred of the present invention, a composite vibration device includes first and second vibrating members defining vibration producing sources, each of the vibrating members being made of a material having a first acoustical impedance $Z_1$, first to third reflecting layers, each of which is made of a material having a second acoustical impedance $Z_2$ which is lower than the first acoustical impedance $Z_1$, and first and second supporting members, each of which is made of a material having a third acoustical impedance $Z_3$ which is higher than the second acoustical impedance $Z_2$. In this composite vibration device, the first supporting member, the first reflecting layer, the first vibrating member, the second reflecting layer, the second vibrating member, the third reflecting layer, and the second supporting member are connected in this order, and when the symbol $S_1$ represents the area of the surface of the vibrating member connected to each reflecting layer, and the symbol $S_2$ represents the area of the surface of each reflecting layer connected to the vibrating member, the area ratio $S_2/S_1$ is about 1 or less, and vibrations produced by the first and second vibrating members are reflected at the interface between the first reflecting layer and the first supporting member, at the interface between the third reflecting layer and the second supporting member, and at the interfaces between the second reflecting layer and the first and second vibrating members.

In addition, the reflecting layers may be formed by stacking a plurality of layers made of materials having different acoustical impedances.

When the wavelength of vibrations produced by only one vibrating member is represented by $\lambda$, the distances from the interface between the reflecting layers and the vibrating member to the interface between the reflecting layers and the supporting members is preferably in a range of $n\cdot\lambda/4\pm\lambda/8$, in which the symbol n represents an odd number.

In the composite vibration device according to the fourth preferred embodiment of the present invention, when the symbol A represents the direction of vibration displacement of the vibrating member, the symbol B represents the direction of vibrations propagating through the vibrating member, and the symbol C represents the direction of vibrations propagating through the reflecting layers, the directions A, B, and C may be combined in various manners. For example, the directions A, B, and C may be arranged substantially parallel to each other, or the direction A may be substantially parallel to the direction B, whereas the direction B may be substantially perpendicular to the direction C. In contrast, the direction A may be substantially perpendicular to the direction B, whereas the direction B may be substantially parallel to the direction C, Alternatively, the direction A may be substantially perpendicular to the direction B and also the direction B may be orthogonal to the direction C.

Other features, elements, steps, characteristics and advantages of the present invention will become apparent from the following detailed description of preferred embodiments with reference to the attached drawings.

DETAILED DESCRIPTION OF PREFERRED EMBODIMENTS

Figure 1A:
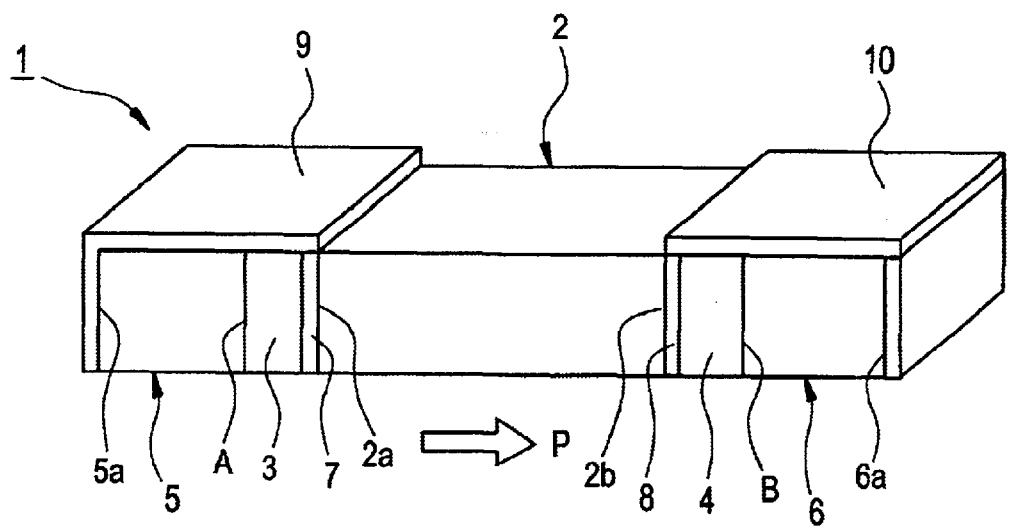
FIGS. 1A and 1B show a perspective view and a longitudinal section illustrating a piezoelectric resonator as a composite vibration device according to a first preferred embodiment of the present invention.

Referring to the drawings, a detailed description of preferred embodiments of the present invention is provided.

Figure 1B:
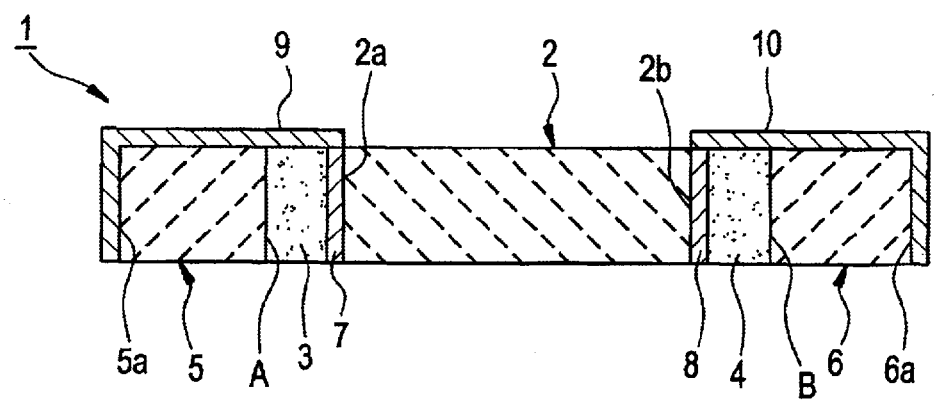

FIGS. 1A and 1B show a perspective view and a longitudinal section illustrating a piezoelectric resonator as a composite vibration device according to a preferred embodiment of the present invention.

A piezoelectric resonator 1 preferably includes a strip-shaped piezoelectric element 2 defining a vibrating member, reflecting layers 3 and 4 connected to each longitudinal end of the piezoelectric element 2, and supporting members 5 and 6 connected to the outer side surfaces of the reflecting layers 3 and 4.

In this preferred embodiment, when the symbol $S_1$ represents the area of the portion where each of end surface 2a and 2b of the piezoelectric element 2 is connected to each of the reflecting layers 3 and 4 and the symbol $S_2$ represents the area of the portion where each of the reflecting layers 3 and 4 is connected to the piezoelectric element 2, that is, the area of the portion where the piezoelectric element 2 is in contact with each of the reflecting layers 3 and 4, the area ratio $S_2/S_1$ is preferably about 1. In other words, the cross-sectional shape of the piezoelectric element 2 is preferably substantially the same as the shapes of the surfaces of the reflecting layers 3 and 4 connected to the piezoelectric element 2, arranged substantially parallel to the cross-sectional surface thereof.

The inventors of the present invention measured the rate of change of resonant frequency by variously changing the area of the end surface of the vibrating member connected to the reflecting layer and the area of the portion where each of the reflecting members is connected to the vibrating member on the end surfaces of the vibration member to be connected to the reflecting layers, that is, the area $S_2$ of the portion where the vibrating member and each reflecting member are in contact with each other. In the piezoelectric resonator 1 used in the experimental example above, the area of the portion where each of the reflecting layers 3 and 4 is connected to the end surfaces 2a and 2b of the piezoelectric element 2 was changed in various sizes to form various piezoelectric resonators and measure the resonant frequencies thereof. The results of the experiment will be shown in FIG. 15.

Figure 15:
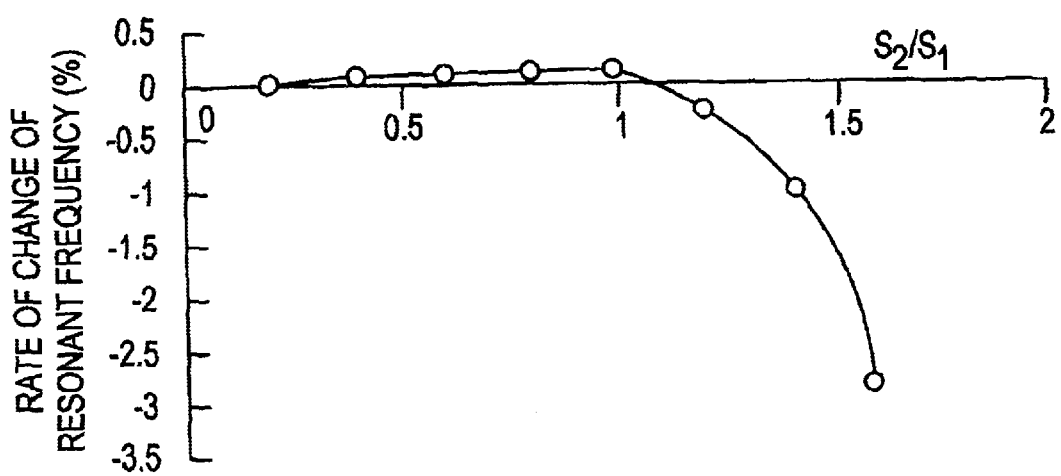
FIG. 15 shows a graph illustrating the rate of change of resonant frequency obtained by changing the area ratio $S_2/S_1$ when the area of a surface of a vibrating member connected to each reflecting layer is set to be $S_1$ and the area of a surface of each reflecting layer connected to the vibrating member, or equivalently an area in which the reflecting layer is in contact with the vibrating member is set to be $S_2$.

As shown in FIG. 15, when the area ratio $S_2/S_1$ is about 1 or less, the rate of change of resonant frequency is about 0.4% or less. In contrast, when the ratio $S_2/S_1$ is greater than about 1, the rate of the change significantly increases. Thus, obviously, setting the ratio $S_2/S_1$ to be about 1 or less more effectively reduces the influence of the structure supported with the reflecting layers 3 and 4 and the supporting members 5 and 6 on the vibration characteristics of the vibrating member.

The piezoelectric element 2 is preferably made of lead titanate and its acoustical impedance $Z_1$ is expressed by a formula $3.4 \times 10^7$ kg/(m$^2 \cdot$s). The piezoelectric element 2 is polarized in a direction indicated by an arrow P, that is, in the lengthwise direction thereof.

The piezoelectric element 2 preferably has a strip-like configuration, in which the top surface, the bottom surface, a pairs of side surfaces thereof have substantially rectangular shapes. In other words, the piezoelectric element 2 preferably has a configuration that resembles a square bar. On the pairs of mutually opposing end surfaces 2a and 2b of the piezoelectric element 2, exciting electrodes 7 and 8 are provided. With the application of an AC voltage from the exciting electrodes 7 and 8, the piezoelectric element 2 vibrates in a length mode in which the end surfaces 2a and 2b are disposed in the lengthwise direction. In other words, the piezoelectric element 2 is a piezoelectric resonant element using the length mode. On the top surface of the piezoelectric resonator 1, terminal electrodes 9 and 10 are provided and electrically connected to the exciting electrodes 7 and 8. The terminal electrodes 9 and 10 are arranged to extend from the top surface of the piezoelectric resonator 1 to outer end surfaces 5a and 6a of the supporting members 5 and 6 to define the end surfaces of the piezoelectric resonator 1. As a result, the piezoelectric resonator 1 is easily surface-mounted on a printed circuit board or other suitable electronic component with the terminal electrodes 9 and 10. In this preferred embodiment, each of the reflecting layers 3 and 4 is preferably made of epoxy resin having an acoustical impedance of about $1.87 \times 10^6$ kg/(m$^2 \cdot$s). Each of the supporting members 5 and 6 is preferably made of ceramic having an acoustical impedance of about $3.4 \times 10^7$ kg/(m$^2 \cdot$s).

Conventionally, in a piezoelectric resonant element using a length mode, vibrations propagate in the lengthwise direction thereof and the propagating direction is substantially parallel to a polarizing direction P. Thus, without substantially influence on the vibrations, it is not possible to support the resonator element using the end surfaces 2a and 2b.

However, in this preferred embodiment, the reflecting layers 3 and 4 and the supporting members 5 and 6 are provided. Thus, the vibration characteristics of the piezoelectric element 2 using the length mode are not influenced by the support for the piezoelectric resonator 1. This principle will be described with reference to FIGS. 2 to 5. In the following description, each length will be referred to as a lengthwise length of the piezoelectric resonator 1.

Figure 2:
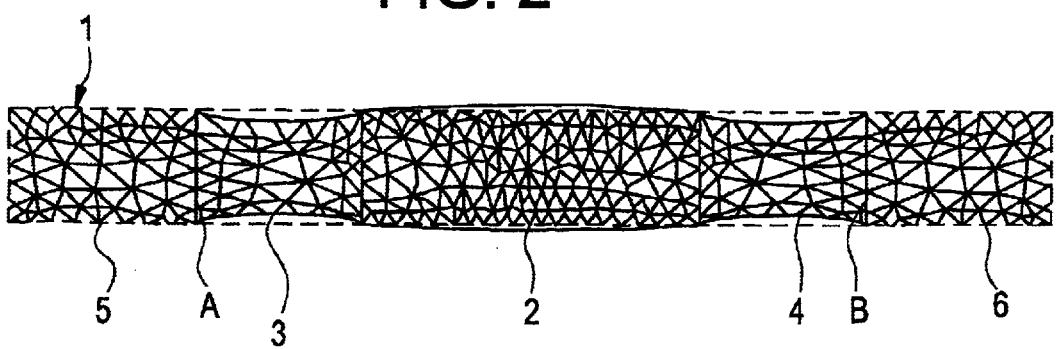
FIG. 2 schematically shows a longitudinal section illustrating the displacement distribution of the piezoelectric resonator obtained from an analysis by a finite element method.

Here, the length $L_1$ of the piezoelectric element 2 is preferably about 0.98 mm, the frequency $F_1$ of the resonator is about 2 MHz, the length $L_2$ of each of the reflecting layers 3 and 4 is about 0.25 mm, and the length of each of the supporting members 5 and 6 is about 0.4 mm. FIG. 2 shows the displacement of the above piezoelectric resonator 1 obtained from analysis by a finite element method. As shown in FIG. 2, very little displacement occurs at the supporting members 5 and 6. Thus, the supporting members 5 and 6 support the piezoelectric resonator 1 with little or no influence on the resonant characteristics of the piezoelectric element 2. This is because the acoustical impedance $Z_2$ of the reflecting layers 3 and 4 is lower than the acoustical impedance $Z_1$ of the piezoelectric element 2 and the acoustical impedance $Z_3$ of the supporting members 5 and 6, vibrations propagated from the piezoelectric element 2 are reflected at interfaces A and B between the reflecting members 3 and 4 and the supporting members 5 and 6 such that the vibrations do not propagate to the supporting members 5 and 6.

Figure 4:
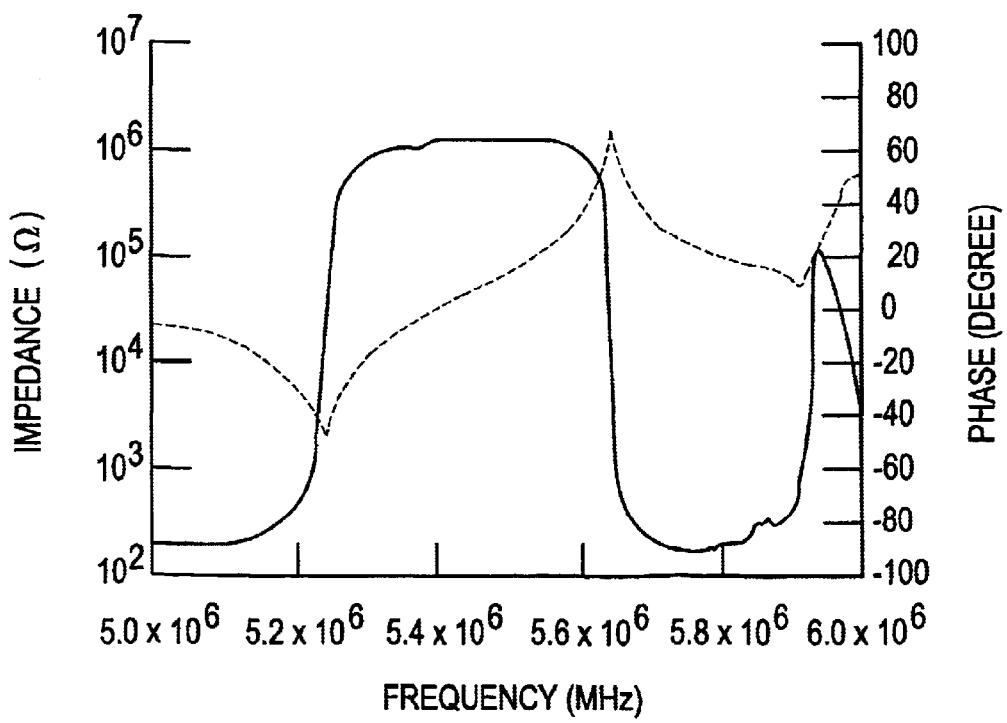
FIG. 4 is a graph illustrating resonant characteristics of the piezoelectric resonator obtained before the resonator is mounted on the substrate.
Figure 5:
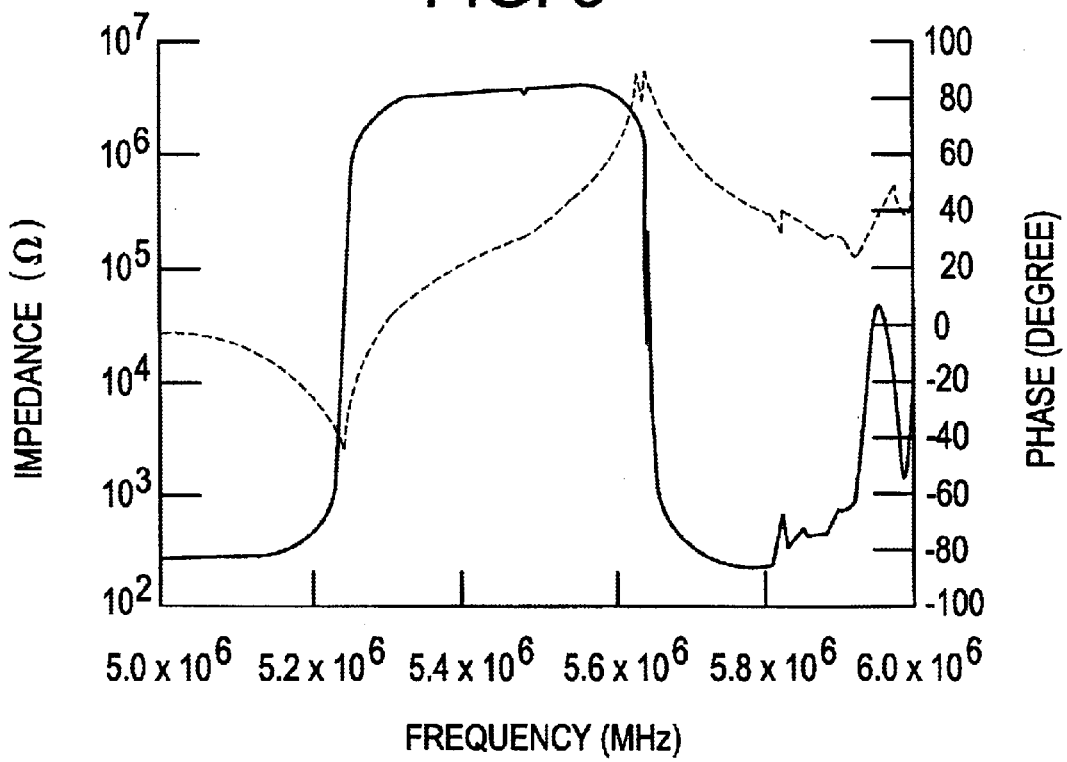
FIG. 5 is a graph illustrating resonant characteristics of the piezoelectric resonator obtained after the resonator is mounted on the substrate.

In light of the results obtained in the piezoelectric resonator 1, the inventors of the present invention repeated the experiments using different materials for the w piezoelectric element 2, the reflecting layers 3 and 4, and the supporting members 5 and 6 included in the piezoelectric resonator 1 and with different sizes thereof. Similar to the above-described preferred embodiment, it was discovered that the propagation of vibrations from the piezoelectric element 2 to each of the supporting members 5 and 6 was substantially suppressed, when the acoustical impedance $Z_2$ of the first and second reflecting layers 3 and 4 was lower than the acoustical impedance $Z_1$ of the piezoelectric element 2 and the acoustical impedance $Z_3$ Of the supporting members 5 and 6. This will be explained with reference to a specific experimental example with reference to FIGS. 4 and FIG. 4 shows impedance-frequency characteristics and phase-frequency characteristics obtained when the piezoelectric resonator 1 is configured according to the following sample specifications. In this figure, the solid line indicates the phase-frequency characteristics and the broken line indicates the impedance-frequency characteristics. The NE+0n of the vertical and lateral axes of graphs shown in FIGS. 4 and 5 is equivalent to N×10$^n$. For example, 1E+02 is equal to $1 \times 10^2$.

Piezoelectric Resonator 1

(1) The piezoelectric element 2 is made of lead titanate having an acoustical impedance $Z_1$ of about $3.4 \times 10^7$ kg/(m$^2 \cdot$s). The length $L_1$ thereof is about 412 mm and the resonant frequency is about 5.4 MHz.

(2) The reflecting layers 3 and 4 are made of epoxy resin having an acoustical impedance $Z_2$ of about $1.87 \times 10^6$ kg/(m$^2 \cdot$s). The length thereof $L_2$ is about 0.07 mm.

(3) The supporting members 5 and 6 are made of lead titanate having an acoustical impedance $Z_3$ of about $3.4 \times 10^7$ kg/(m$^2 \cdot$s). The length thereof $L_3$ is about 300 mm.

In addition, the width of the piezoelectric resonator 1 was about 250 mm and the thickness thereof was about 200 mm.

Figure 3:
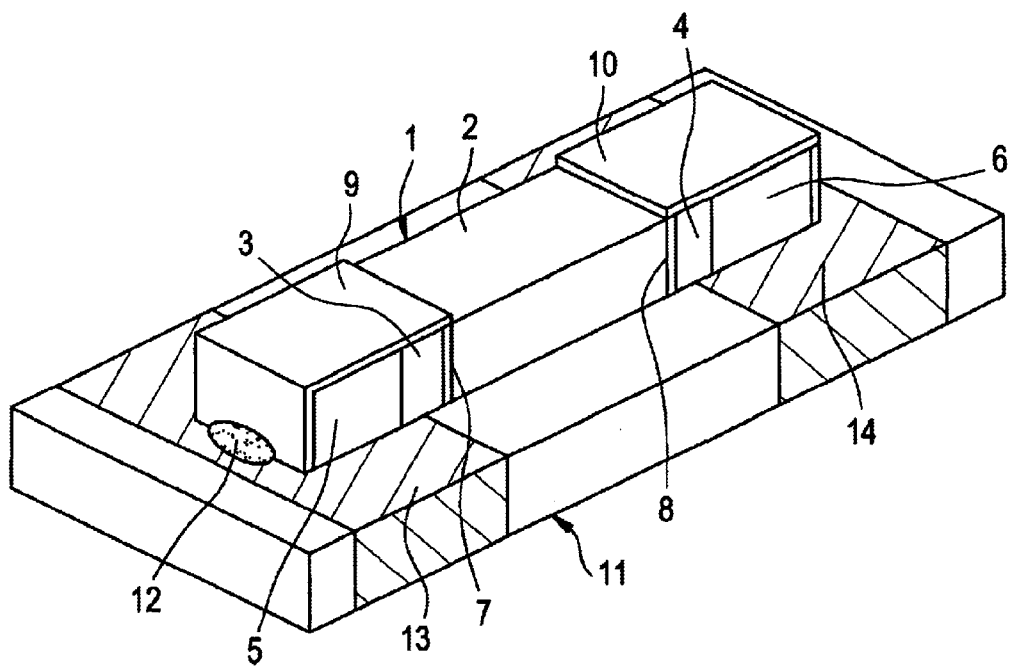
FIG. 3 shows a perspective view of the piezoelectric resonator mounted on a substrate.

Then, as shown in FIG. 3, the piezoelectric resonator 1 was bonded and fixed to a substrate 11 with a conductive adhesive 12. When the bonding is performed with the conductive adhesive 12, a space necessary for producing vibrations is obtained between the bottom surface of the piezoelectric element 2 and the top surface of the substrate 11 by fixing the resonator 1 onto the substrate 11 with the conductive adhesive 12.

Furthermore, the terminal electrodes 9 and 10 are bonded to electrodes 13 and 14 on the substrate 11 with the conductive adhesive 12. However, the conductive adhesive 12 is not disposed on the piezoelectric element 2 and the reflecting layers 3 and 4.

FIG. 5 shows the frequency characteristics of the piezoelectric resonator 1 obtained after being mounted on the substrate 11. In FIG. 5, similarly, the broken line indicates impedance-frequency characteristics and the solid line indicates phase-frequency characteristics.

When comparison is made between the graphs of FIG. 4 and FIG. 5, the frequency characteristics of the piezoelectric resonator 1 are almost the same as the frequency characteristics thereof obtained after being fixed on the substrate 11. In other words, even when the supporting members 5 and 6 mechanically support the piezoelectric resonator 1, the resonant characteristics of the piezoelectric element 2 do not deteriorate.

Figure 6:
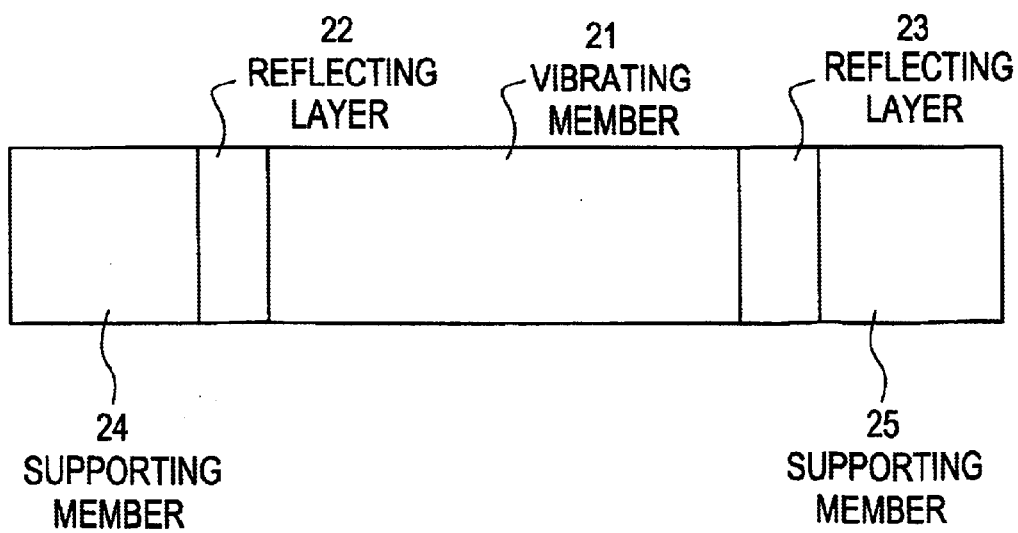
FIG. 6 shows a general illustration of a composite vibration device according to various preferred embodiments of the present invention.

As seen in FIGS. 1 to 5, in the piezoelectric resonator 1 of the vibration device according to preferred embodiments of the present invention, on each side of the piezoelectric element 2 defining the vibrating member, each of the reflecting layers 3 and 4 is arranged and the supporting members 5 and 6 are connected to the outer side surfaces of the reflecting layers 3 and 4. With this arrangement, the piezoelectric resonator 1 is effectively supported without hindering vibrations of the piezoelectric element 2. FIG. 6 is a general view illustrating the above arrangement. In a composite vibration device according to the invention shown in FIG. 6, on each side of a vibrating member 21 defining a vibrating source, reflecting layers 22 and 23 are connected such that vibrations from the vibrating member 21 are propagated. Additionally, supporting members 24 and 25 are connected to the outer side surfaces of the reflecting layers 22 and 23. In this case, as shown above, when the acoustical impedance $Z_2$ of the reflecting layers 22 and 23 is lower than the acoustical impedance $Z_1$ of the vibrating member 21 and the acoustical impedance $Z_3$ of the supporting members 24 and 25, similar to the above-described preferred embodiment, the vibration device 20 having combined different material members is mechanically supported by the supporting members 24 and 25 with very little influence on the vibration characteristics of the vibration device 21.

In the above-described preferred embodiment, the piezoelectric element 2 is used as a vibrating member. However, in this invention, as long as the above impedance relationships are obtained among the impedance $Z_1$ of the vibrating member 21, the impedance $Z_2$ of the reflecting layers 22 and 23, and the impedance $Z_3$ of the supporting members 24 and 25, as in the case of the above-described preferred embodiment, propagated vibrations are reflected at the interfaces between the reflecting layers 22 and 23 and the supporting members 24 and 25. Thus, the vibrating member 21 is not restricted to the above-described piezoelectric element. In other words, as the vibrating member 21, devices other than the piezoelectric element 2, such as an electrostrictive element and other suitable types of vibrating members may be used.

In addition, the materials of the reflecting members 22 and 23 and the supporting members 24 and 25 are also not restricted to the above-described materials. As long as the relationships among the acoustical impedances $Z_1$ to $Z_3$ are maintained, the materials thereof can be arbitrarily selected.

Figure 7:
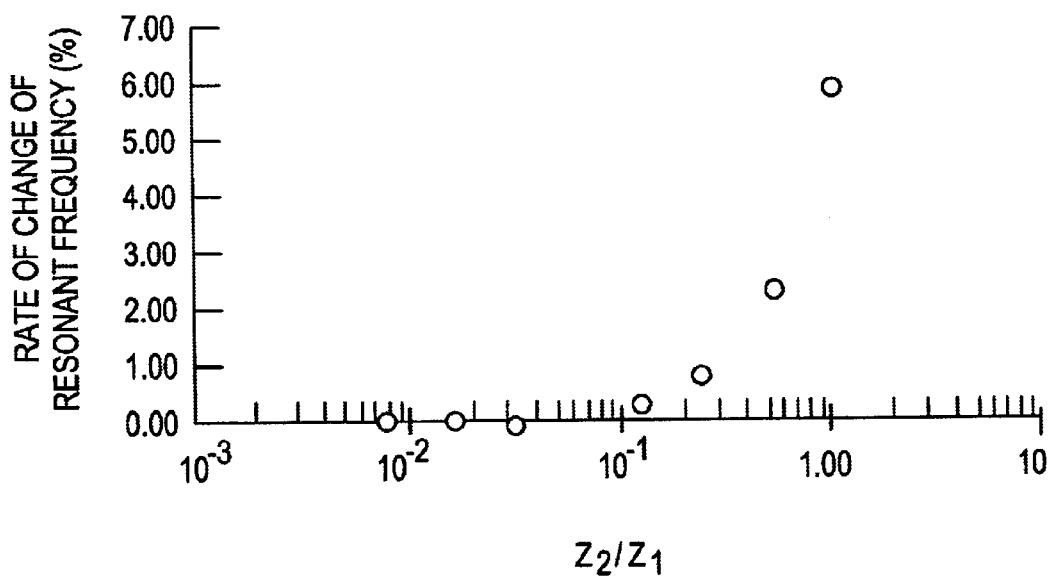
FIG. 7 shows a graph illustrating the relationship between an acoustical impedance ratio $Z_2/Z_1$ and the rate of change of resonant frequency in the piezoelectric resonator according to the first preferred embodiment of the present invention.
Figure 8:
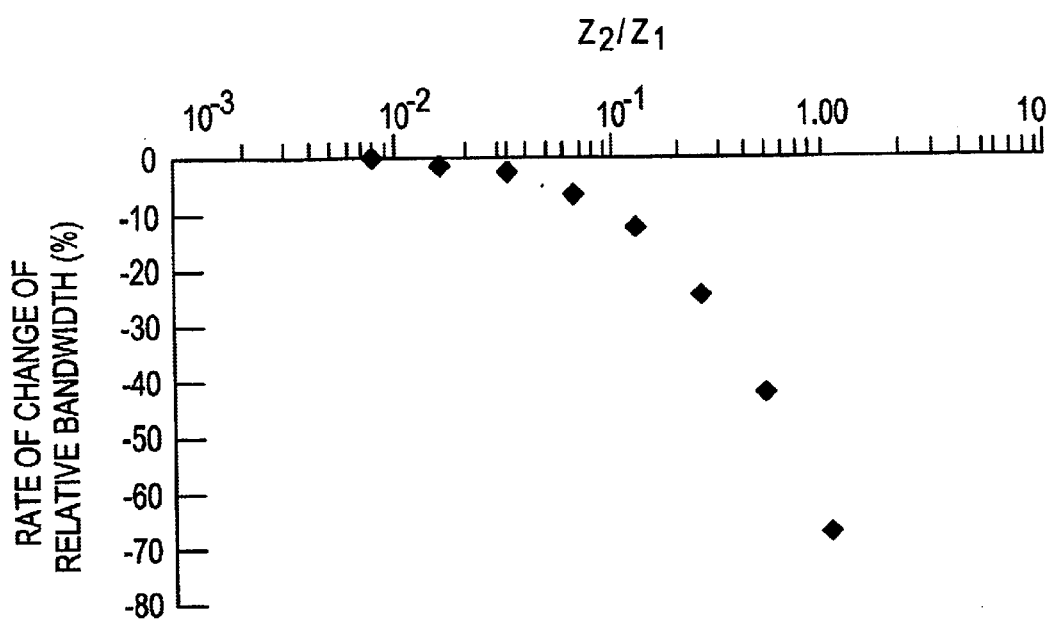
FIG. 8 shows a graph illustrating the relationship between an acoustical impedance ratio $Z_2/Z_1$ and the rate of change of relative bandwidth in the piezoelectric resonator.

Furthermore, the inventors of the present invention measured the rates of changes of the resonant frequency and bandwidth of the piezoelectric resonator 1 with various materials of the reflecting members of the piezoelectric resonator 1. FIGS. 7 and 8 show the results of the measurements. Here, to measure the resonant-frequency change rate (%) and the relative-bandwidth change rate (%), the types of ceramic used as the material of the piezoelectric element 2, the types of epoxy resin used as the material of the reflecting layers 3 and 4, and the value of standardized acoustical impedance $Z_2$, that is, the ratio $Z_2/Z_1$ were varied.

As shown in FIGS. 7 and 8, when the acoustical impedance ratio $Z_2/Z_1$ was about 0.2 or less, and preferably about 0.1 or less, the change rate of the resonant frequency significantly reduces to about 0.2% or less. When the ratio is about 0.1 or less, the change rate is reduced to about 0.01% or less. Similarly, regarding the change rate of the relative bandwidth, it is found that when the acoustical impedance ratio $Z_2/Z_1$ is about 0.2 or less, the change rate thereof is about −15%, and when the ratio is about 0.1 or less, the rate is about −8% or less.

Therefore, preferably, the acoustical impedance ratio $Z_2/Z_1$ is about 0.2 or less, and more preferably about 0.1 or less.

Figure 9:
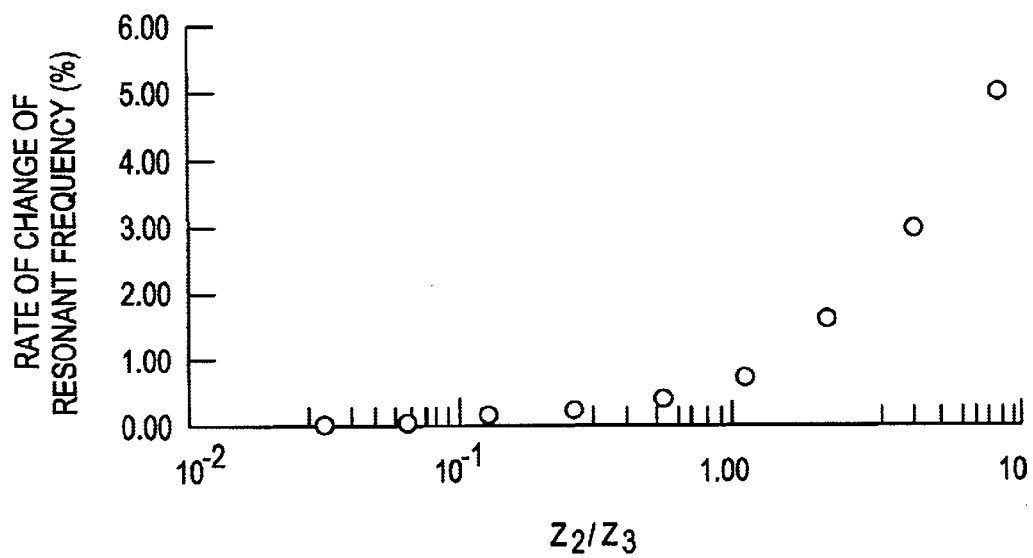
FIG. 9 shows a graph illustrating the relationship between an acoustical impedance ratio $Z_2/Z_3$ and the rate of change of resonant frequency in the piezoelectric resonator.
Figure 10:
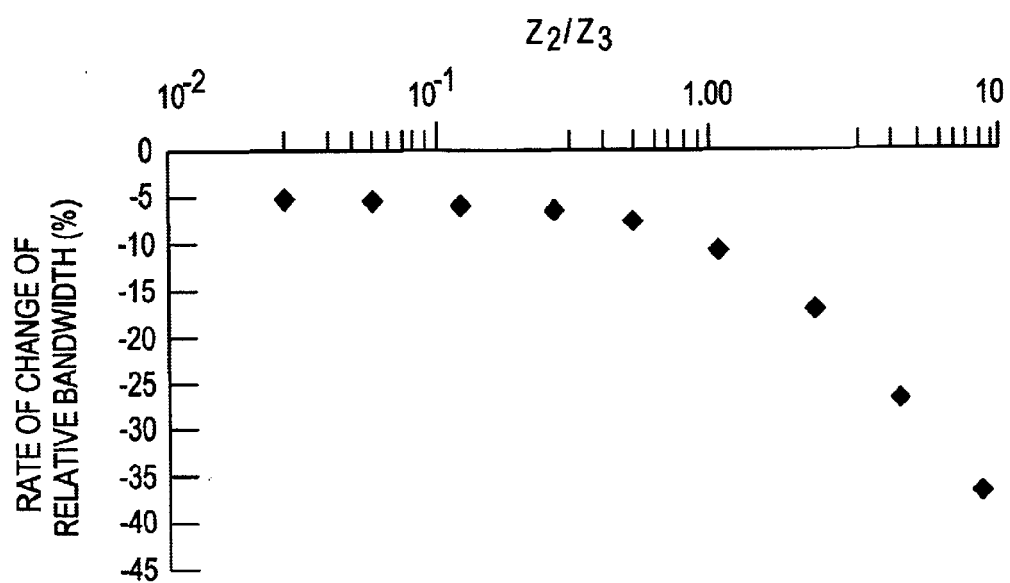
FIG. 10 shows a graph illustrating the relationship between an acoustical impedance ratio $Z_2/Z_3$ and the rate of change of relative bandwidth in the piezoelectric resonator.

Furthermore, the inventors varied the types of materials of the reflecting layers 3 and 4 and the supporting members 5 and 6 to change the acoustical impedance ratio $Z_2/Z_3$. Then, similarly, the rates (%) of changes of the resonant frequency and relative bandwidth of the piezoelectric resonator 1 were measured. FIGS. 9 and 10 show results obtained in the measurements.

As shown in FIGS. 9 and 10, when the acoustical impedance ratio $Z_2/Z_3$ was about 0.2 or less, the frequency change rate was about 0.2% or less and the relative bandwidth was about −7% or less. In addition, when the ratio was about 0.1% or less, the frequency change rate was about 0.05% or less and the relative bandwidth was about −6% or less. As a result, the acoustical impedance ratio $Z_2/Z_3$ is about 0.2 or less, and preferably to about 0.1 or less.

Figure 11:
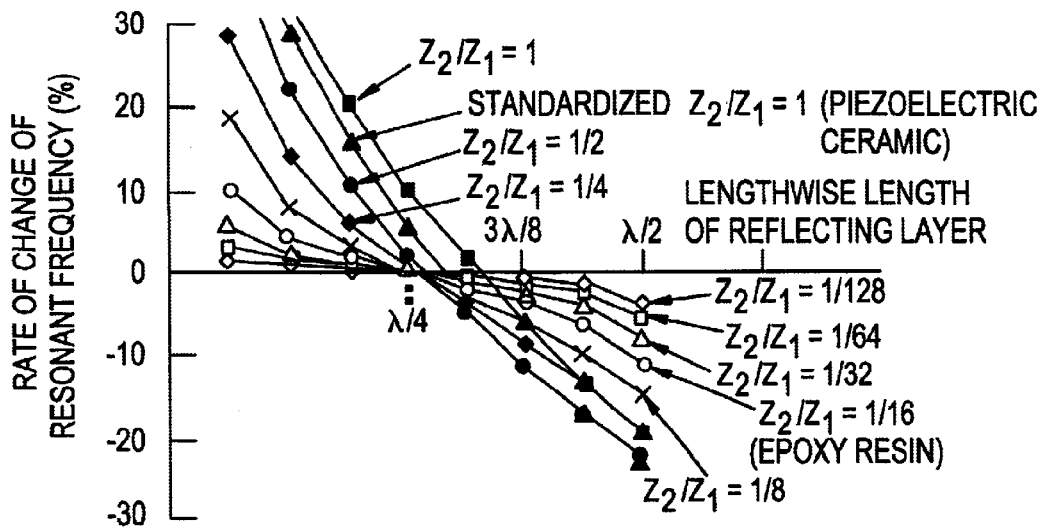
FIG. 11 shows a graph illustrating the relationship between the length of each reflecting layer in the lengthwise direction of the piezoelectric resonator and the rate of change of resonant frequency obtained when using reflecting layers having different acoustical impedances.
Figure 12:
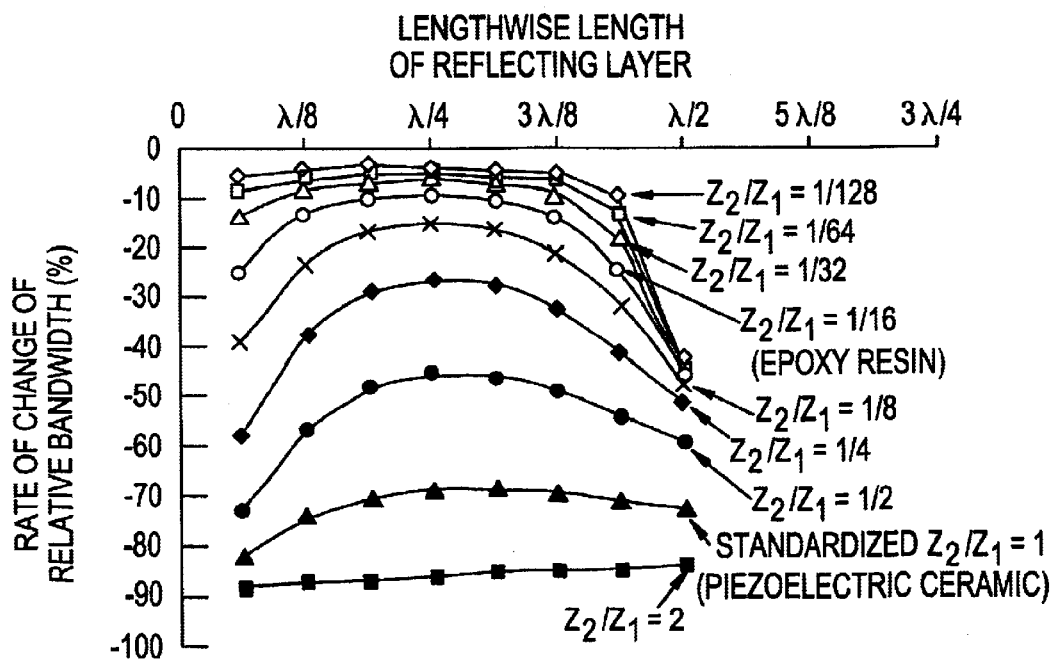
FIG. 12 shows a graph illustrating the relationship between the length of each reflecting layer in the lengthwise direction of the piezoelectric resonator and the rate of change of relative bandwidth obtained when using the reflecting layers having different acoustical impedances.

In addition, the inventors measured the rates of changes of the resonant frequency and relative bandwidth of the piezoelectric resonator 1 with varied acoustical impedance ratios $Z_2/Z_1$. FIGS. 11 and 12 show results from the measurements. In FIGS. 11 and 12, as materials of the reflecting layers 3 and 4, epoxy resin, ceramic, and a mixture of powder having other acoustical impedances with these materials were used to change the acoustical impedance $Z_2$ in an arbitrary range from about $1/128$ of the acoustical impedance $Z_1$.

The lateral lines shown in FIGS. 11 and 12 indicate the lengthwise length of each of the reflecting layers 3 and 4, that is, the lengthwise length of the piezoelectric resonator 1. In other words, the lengthwise length of each of the reflecting layers 3 and 4 is substantially equivalent to the length of a direction connecting the surface of each reflecting layer connected to the piezoelectric element 2 as the vibrating member and the surface of each reflecting layer connected to each of the supporting members 5 and 6. That is, it is the length of the direction in which vibrations propagate through each reflecting layer.

As shown in FIGS. 11 and 12, it was discovered that when the acoustical impedance ratio $Z_2/Z_1$ was smaller, i.e. about $1/32$ or less, and more preferably, about $1/64$ or less, even though the lengthwise lengths of the reflecting layers 3 and 4, or equivalently, the thicknesses thereof slightly vary from about $\lambda/4$, the rates of changes of the resonant frequency and the relative bandwidth do not substantially increase. Thus, when the ratio $Z_2/Z_1$ is about $1/32$ or less, and preferably to about $1/64$ or less, the lengthwise lengths of the reflecting layers 3 and 4 are less restricted.

On the other hand, as shown in FIGS. 11 and 12, regardless of the ratio $Z_2/Z_1$, when the lengths of the reflecting layers 3 and 4 are about λ/4, the rates of changes of the resonant frequency and the relative bandwidth of the piezoelectric resonator 1 are significantly decreased.

Figure 13:
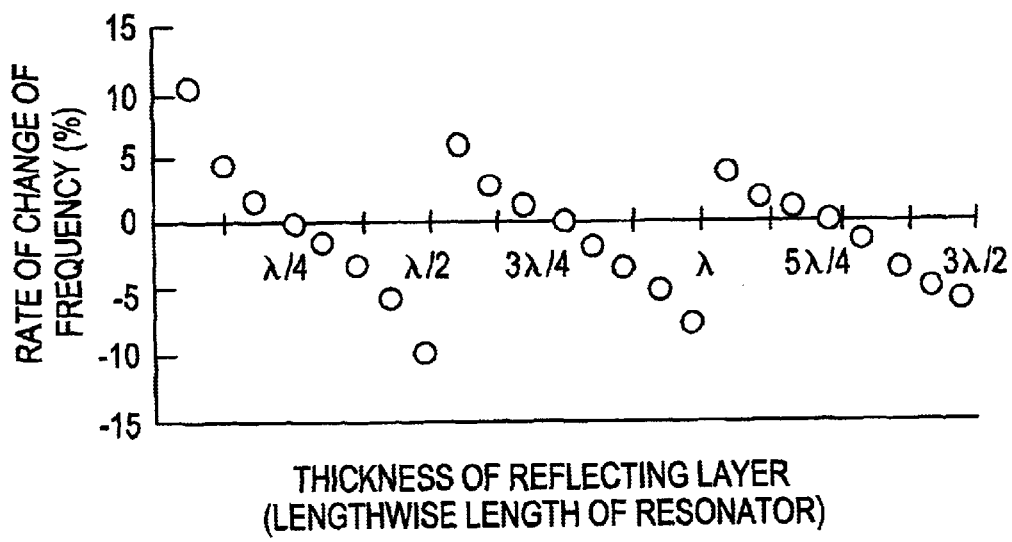
FIG. 13 shows a graph illustrating the rate of change of resonant frequency obtained when changing the thickness of each reflecting layer, or equivalently the length of the reflecting layer in the lengthwise direction of the piezoelectric resonator.
Figure 14:
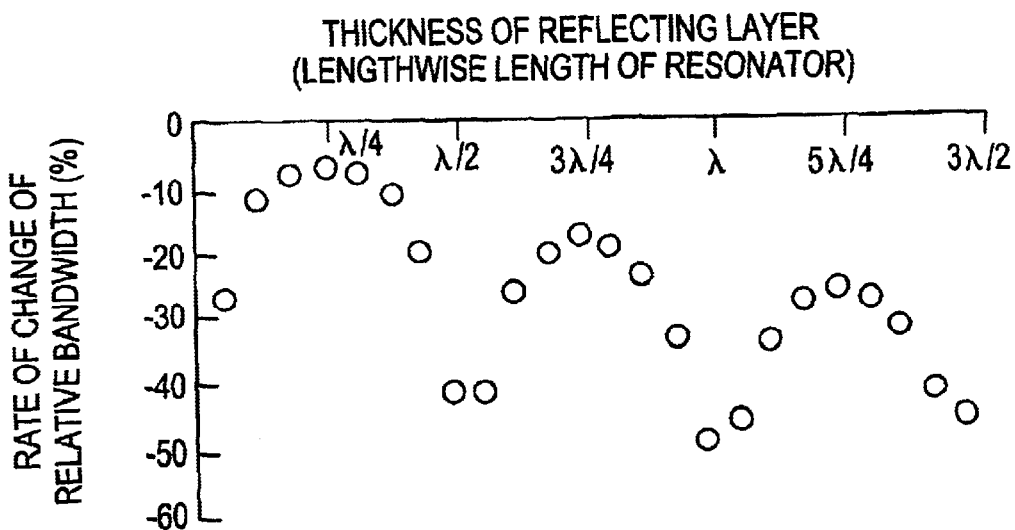
FIG. 14 shows a graph illustrating the rate of change of relative bandwidth obtained when changing the thickness of each reflecting layer, or equivalently the length of the reflecting layer in the lengthwise direction of the piezoelectric resonator.

In addition, the relationships between the thicknesses of the reflecting layers 3 and 4 and the rates of changes of the resonant frequency and the relative bandwidth were measured by varying the thickness of the reflecting layers 3 and 4. FIGS. 13 and 14 show results from the measurements. As shown in FIGS. 11 to 14, preferably, the lengths of the reflecting layers 3 and 4 are within an approximate range of n·λ/4±λ/8, in which the symbol n is an odd number, and more preferably, the lengths thereof are about λ/4.

In other words, the area $S_1$ of the surface of the piezoelectric element 62 connected to each of the reflecting layers 65 and 66 is preferably substantially equal to the area $S_2$ of the surface of each of the reflecting layers 65 and 66 connected to the piezoelectric element 62. In other words, the value of $S_2/S_1$ is preferably about 1.

Figure 16A:
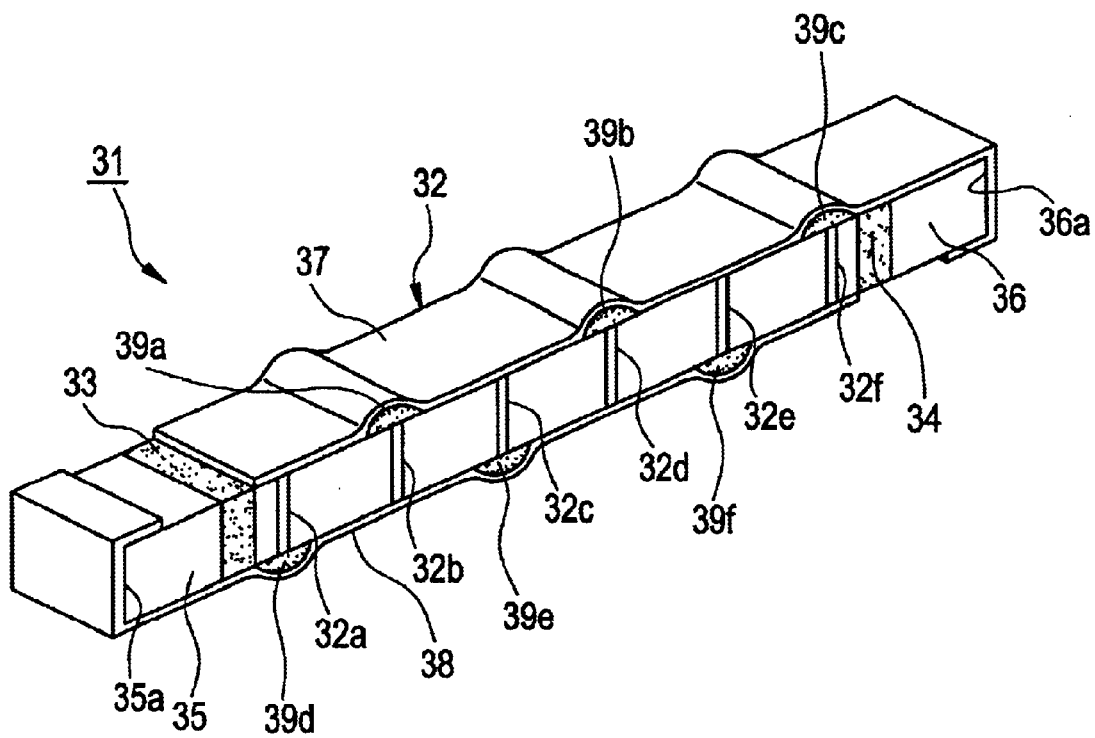
FIGS. 16A and 16B show a perspective view and a partially cut-away longitudinal section of a piezoelectric resonator according to a second preferred embodiment of the present invention.
Figure 16B:
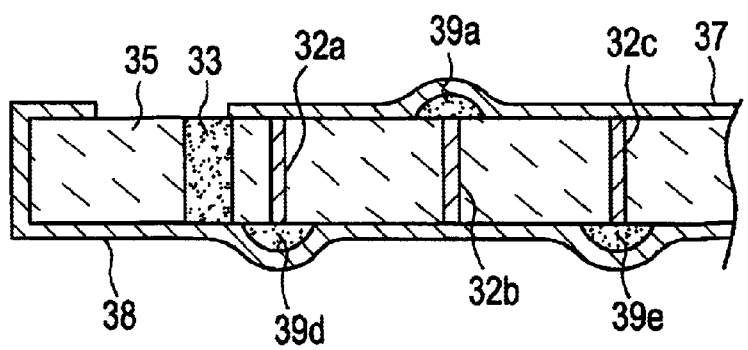

FIGS. 16A and 16B show a perspective view and a partially cut-away longitudinal section of a piezoelectric resonator defining a composite vibration device according to a second preferred embodiment of the invention.

A piezoelectric resonator 31 has a piezoelectric element 32 that is configured to have a strip-like or a square bar shape. The piezoelectric element 32 is a piezoelectric element using the sixth harmonic of the length mode. The piezoelectric resonator 31 of this preferred embodiment is preferably the same as the piezoelectric resonator 1 of the first preferred embodiment except that the piezoelectric element 32 is used as an alternative to the piezoelectric element 2 and an electrode structure for exciting the piezoelectric element 32 is different from that of the first preferred embodiment.

The piezoelectric element 32 is preferably made of a piezoelectric ceramic, such as lead zirconate titanate having an acoustical impedance of about $2.6 \times 10^7$ kg/(m²·s).

To excite with the sixth harmonic of the length mode in the piezoelectric element 32, six exciting elements 32a to 32f are provided and extend in the cross-sectional direction of the piezoelectric element 32. In other words, the exciting electrodes 32a to 32f are arranged substantially parallel to and in the cross-sectional direction of the piezoelectric element 32 in such a manner that five piezoelectric layers are present between the exciting electrodes 32a to 32f. In addition, the five piezoelectric layers are polarized evenly in the lengthwise direction of the piezoelectric element 32.

A terminal electrode 37 is provided on the top surface of the piezoelectric resonator 31 to be electrically connected to the exciting electrodes 32a, 32c, and 32e. On the bottom surface of the piezoelectric 31, a terminal electrode 38 is provided, which is electrically connected to the exciting electrodes 32b, 32d, and 32f.

To electrically insulate the exciting electrodes 32b, 32d, and 32f from the terminal electrode 37, at the top ends of the exciting electrodes 32b, 32d, and 32f insulative materials 39a to 39c are provided. Similarly, to electrically insulate the exciting electrodes 32a, 32c, and 32e from the terminal electrode 38, at the bottom ends of the exciting electrodes 32a, 32c, and 32e insulative materials 39d to 39f are provided.

The reflecting layers 33 and 34 are arranged at each end in the lengthwise direction of the piezoelectric element 32 and are made of epoxy resin having an acoustical impedance ratio ($Z_2/Z_1$) of about 1/16.

In addition, to the outer side surfaces of the reflecting layers 33 and 34, supporting members 35 and 36 are connected which are made of piezoelectric ceramic such as lead zirconate titanate having an acoustical impedance ($Z_2/Z_3$) of about 1/16.

Each of the terminal electrodes 37 and 38 is arranged to extend to each of the mutually opposing end surfaces of the piezoelectric resonator 31, that is, each of outer end surfaces 35a and 36a of the supporting members 35 and 36.

In this preferred embodiment, as in the above-described preferred embodiment, the cross-sectional shapes of the reflecting members 33 and 34 and the supporting members 35 and 36 are preferably the same as that of the piezoelectric element 32. Thus, the piezoelectric resonator 31 has a substantially square bar shape.

As shown in the second preferred embodiment, the piezoelectric vibrating element 32 may be a piezoelectric element using the harmonic of a length mode.

Figure 17:
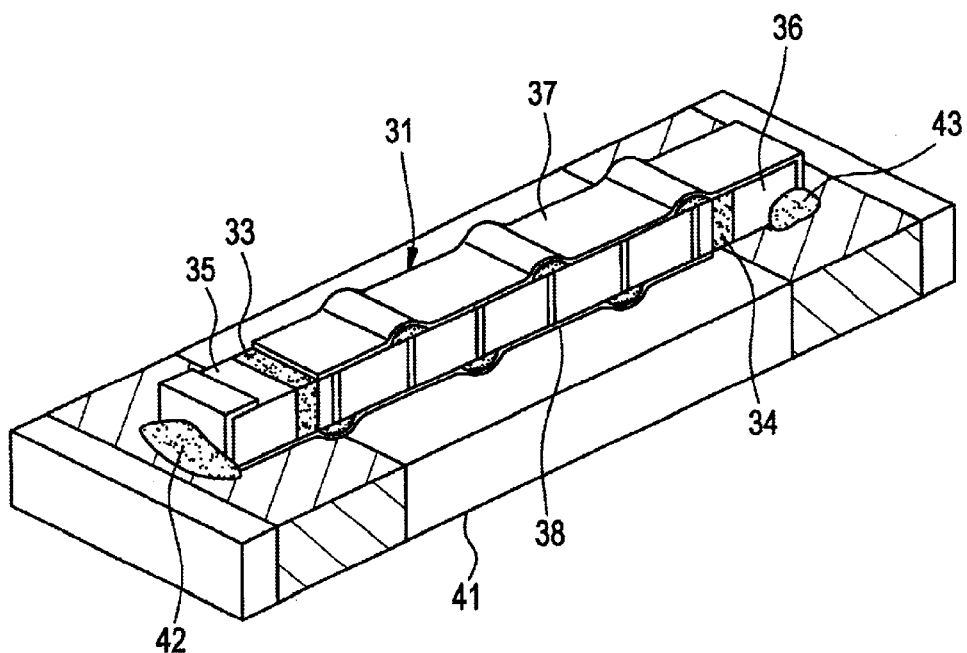
FIG. 17 shows a perspective view of the piezoelectric resonator of the second preferred embodiment mounted on a substrate.
Figure 18:
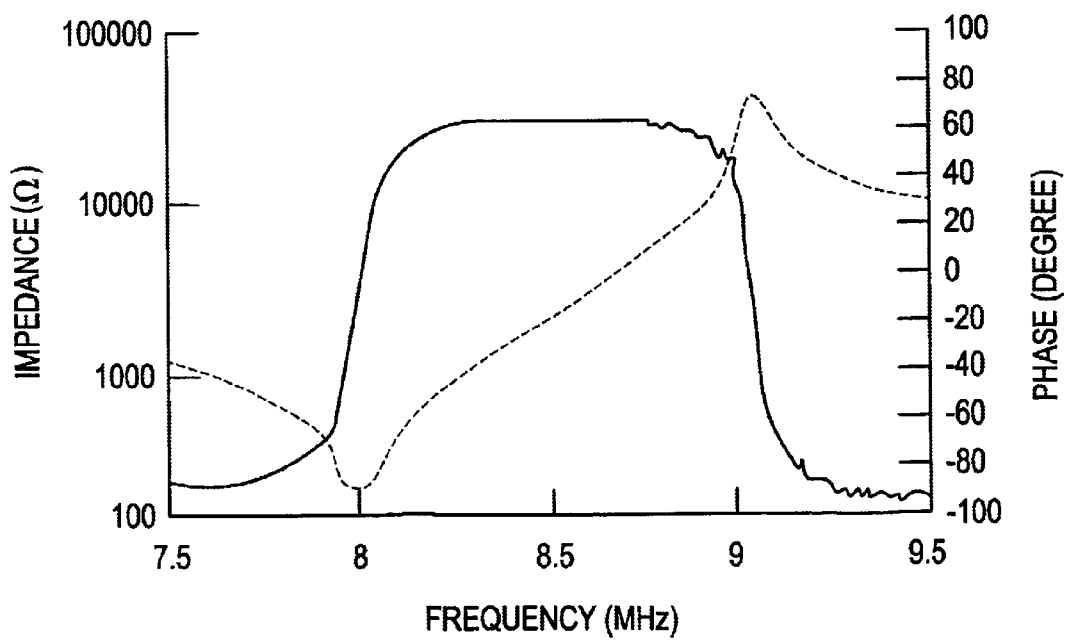
FIG. 18 shows a graph illustrating resonant characteristics obtained before the piezoelectric resonator of the second preferred embodiment is mounted on the substrate.
Figure 19:
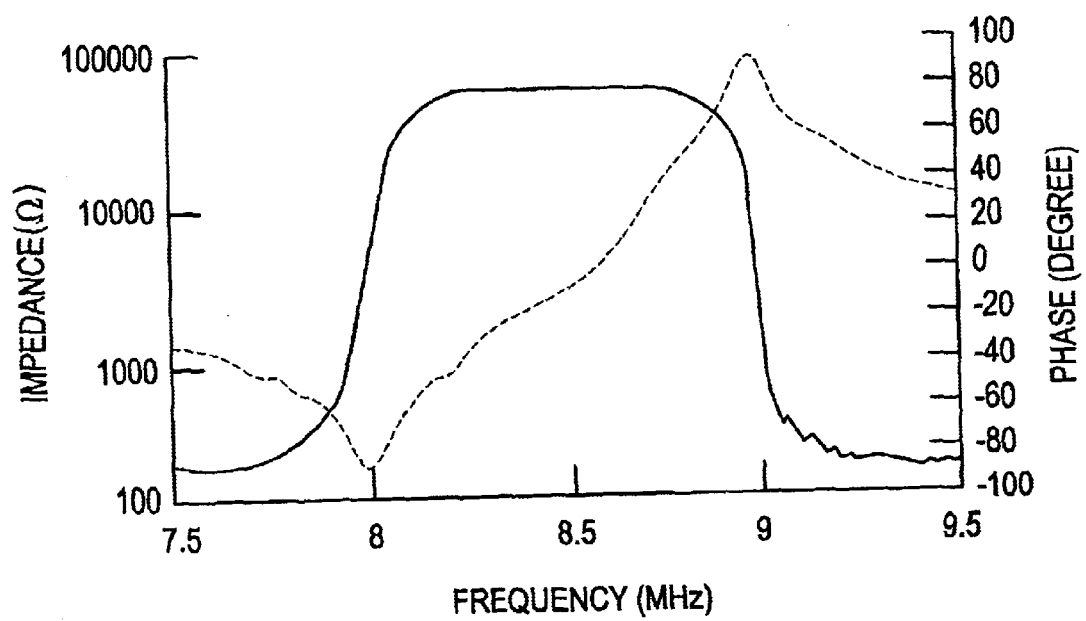
FIG. 19 shows a graph illustrating resonant characteristics obtained after the piezoelectric resonator of the second preferred embodiment is mounted on the substrate.

FIG. 18 shows the impedance-frequency characteristics and phase-frequency characteristics of the piezoelectric resonator 31. Additionally, as shown in FIG. 17, FIG. 19 shows the impedance-frequency characteristics and phase-frequency characteristics obtained after the piezoelectric resonator 31 is bonded and fixed onto a substrate 41 with conductive adhesives 42 and 43. In each of FIGS. 18 and 19, the solid line indicates the phase-frequency characteristics and the broken line indicates the impedance-frequency characteristics.

When comparison is made between the graphs shown in FIG. 18 and FIG. 19, in the second preferred embodiment, similar to the first preferred embodiment, the characteristics of the piezoelectric resonator 31 as the single unit obtained before being mounted on the substrate 41 are almost the same as the characteristics thereof obtained after being mounted on the substrate 41.

Thus, in the second preferred embodiment, similarly, even when the supporting members 35 and 36 mechanically support the piezoelectric resonator 31, the resonant characteristics of the piezoelectric element 32 are not significantly affected.

Figure 20:
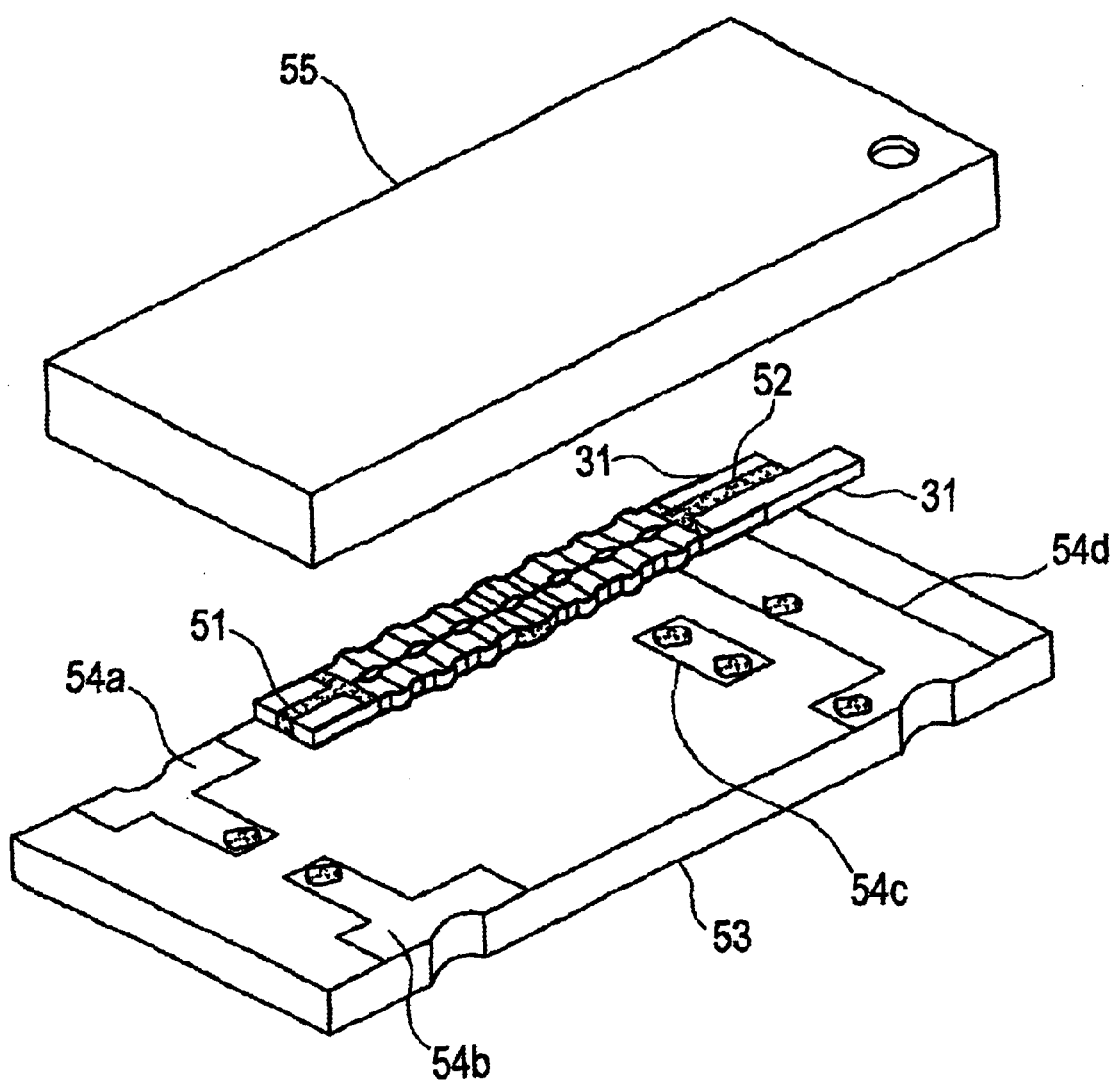
FIG. 20 shows an exploded perspective view illustrating a filter incorporating two piezoelectric resonators as a sample application of the present invention.

Alternatively, as shown in an exploded perspective view in FIG. 20, a plurality of piezoelectric resonators 31 may be bonded to each other with insulative adhesives 51 and 52 to be mounted on a substrate 53. In the structure shown in FIG. 20, the two piezoelectric resonators 31 are bonded together and are electrically connected to define a filter circuit. The electrical connection between the two piezoelectric resonators 31 is made by conductive patterns 54a to 54d provided on the substrate 53. In addition, a metal cap 55 is fixed on the substrate 53. The metal cap 55 is fixed to the substrate 53 with an insulative adhesive to enclose and seal the piezoelectric resonators 31. As shown in FIG. 20, the vibration device according to the present invention may be applied not only to piezoelectric resonators but also to filters.

Figure 21:
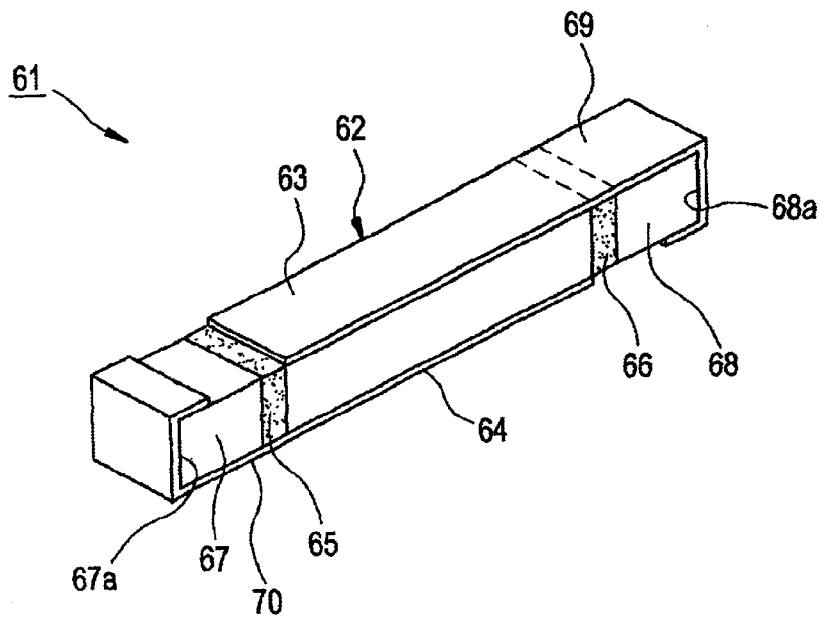
FIG. 21 shows a perspective view illustrating a piezoelectric resonator using a thickness-shear mode as a composite vibration device according to a third preferred embodiment of the invention.

FIG. 21 is a perspective view showing a piezoelectric resonator according to a third preferred embodiment of the invention. A piezoelectric resonator 61 preferably includes a piezoelectric element 62 using a thickness-shear mode. The piezoelectric element 62 of the third preferred embodiment is preferably made of a piezoelectric ceramic and has a substantially rectangular plate shape. An exciting electrode 63 is provided on the top surface of the piezoelectric element 62 and an exciting electrode 64 is provided on the bottom surface thereof. The piezoelectric element 62 is polarized in its lengthwise direction. By applying an AC voltage from the exciting electrodes 63 and 64, the piezoelectric element 62 is excited in the thickness-shear mode.

Figure 34:
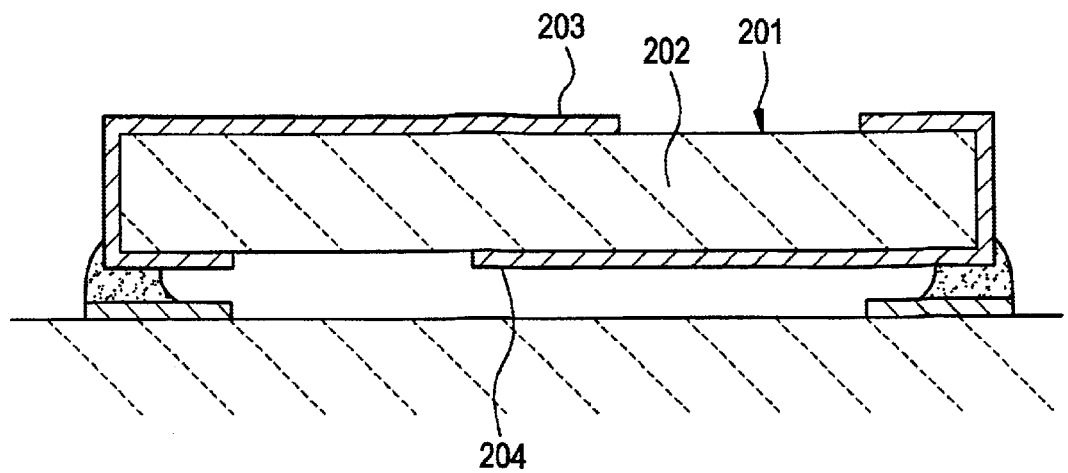
FIG. 34 schematically shows a partially cut-away longitudinal section illustrating a conventional energy-trap piezoelectric resonator mounted on a substrate.
Figure 35:
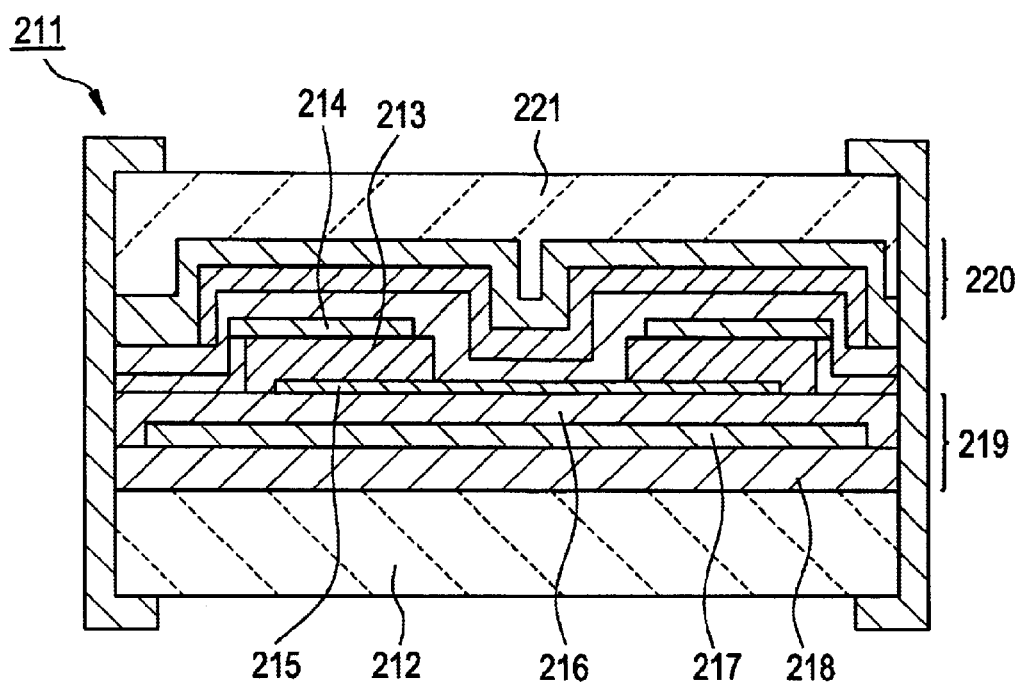
FIG. 35 shows a longitudinal section illustrating an example of a conventional bulk acoustic wave filter.

Unlike the conventional energy-trap piezoelectric resonator 201 using the thickness-shear mode (see FIG. 34), the piezoelectric element 62 includes the exciting electrodes 63 and 64 arranged to cover the entire top and bottom surfaces thereof, respectively. Thus, the piezoelectric resonator 61 is not an energy-trap piezoelectric resonator.

On each side in the lengthwise direction of the piezoelectric element 62, as in the first preferred embodiment, reflecting layers 65 and 66 and supporting members 67 and 68 are provided. The thicknesses of the w reflecting layers 65 and 66, that is, the length of a direction connecting the piezoelectric element 62 and each of the supporting members 67 and 68 is approximately $\lambda/4$, where the wavelength of propagated vibrations is $\lambda$. In addition, each of the exciting electrodes 63 and 64 extends to each of terminal electrodes 69 and 70. The terminal electrodes 69 and 70 extend to the end surfaces of the piezoelectric resonator 62, that is, to external end surfaces 67a and 68a of the supporting members 67 and 68.

In the piezoelectric resonator 61 of the third preferred embodiment, the piezoelectric element 62 is not an energy-trap element. However, similar to the first preferred embodiment, the reflecting layers 65 and 66 and the supporting members 67 and 68 are provided. Specifically, the area $S_1$ of a surface of the piezoelectric element 62 connected to each of the reflecting layers 65 and 66 is approximately equal to the area $S_2$ of a surface of each of the reflecting layers 65 and 66 connected to the piezoelectric element 62. That is, the value of $S_2/S_1$ is preferably about 1.

In addition, the acoustical impedance $Z_1$ of the piezoelectric element 62, the acoustical impedance $Z_2$ of each of the reflecting layers 65 and 66, and the acoustical impedance $Z_3$ of each of the supporting members 67 and 68 are preferably set in the same manner as it the first preferred embodiment. Accordingly, vibrations propagating through the piezoelectric element 62 are reflected at the interfaces between the reflecting layers 65 and 66 and the supporting members 67 and 68. As a result, even though the supporting members 67 and 68 mechanically support the piezoelectric element 62, as in the first preferred embodiment, the resonant characteristics of the piezoelectric element 62 are not significantly influenced. Thus, even when using a thickness-shear mode, the present invention does not need a vibration attenuating section and thereby the size of the piezoelectric resonator using a thickness-shear mode is greatly reduced.

In other words, since the thickness of each of the reflecting layers 65 and 66 (the lengthwise length of the resonator 61) is only about $\lambda/4$, a large vibration attenuating section is not required, as in the conventional energy-trapped piezoelectric resonator 201. Additionally, the lengths of the supporting members 67 and 68 in the lengthwise direction of the piezoelectric resonator 61 are significantly reduced within a range capable of providing the reflecting interfaces. Thus, the length of the piezoelectric resonator 61 is significantly shorter than that of the conventional piezoelectric resonator 201.

Figure 22:
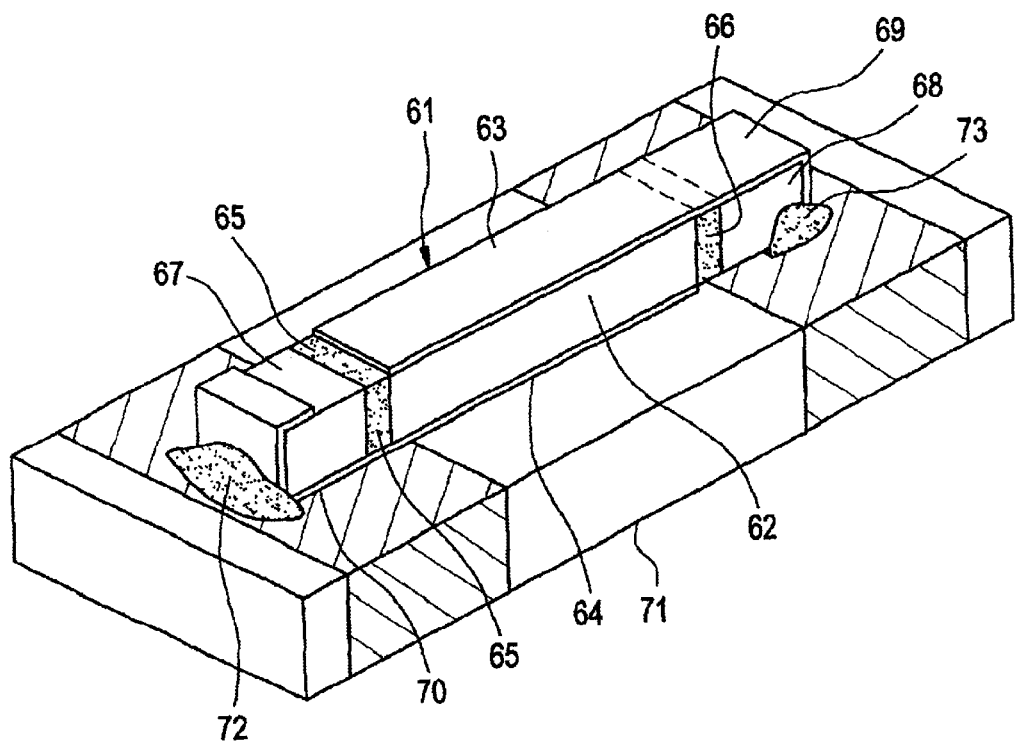
FIG. 22 shows a perspective view of the piezoelectric resonator of the third preferred embodiment when the resonator is mounted on a mounting substrate.
Figure 23:
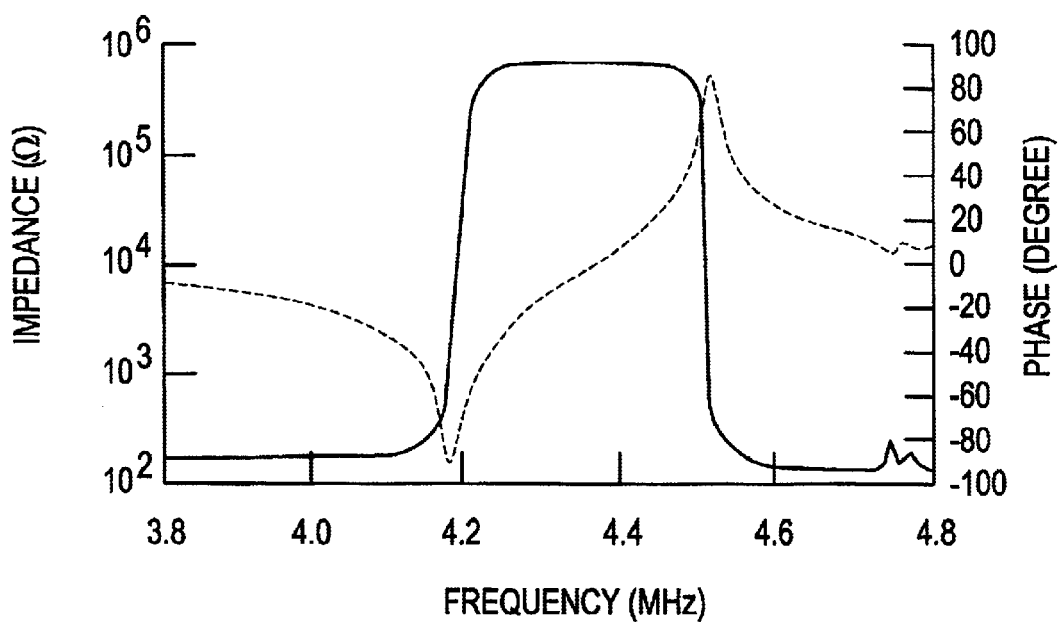
FIG. 23 shows a graph illustrating resonant characteristics obtained when the piezoelectric resonator of the third preferred embodiment is mounted on a substrate.

There is almost no change in the frequency characteristics of the piezoelectric resonator 61 obtained when the piezoelectric resonator 61 is fixed on a substrate 71 with conductive adhesives 72 and 73, as shown in FIG. 22. In FIG. 23, the broken line indicates impedance-frequency characteristics and a solid line indicates phase-frequency characteristics. FIG. 23 shows the characteristics of the piezoelectric resonator 61 obtained after being mounted on the mounting substrate 71. Since the characteristics obtained before mounting and after mounting are almost the same, the illustration thereof has be omitted. A piezoelectric resonator defining the vibration device according to the present invention is not restricted to resonators using the vibration modes as in the first to third preferred embodiments. In addition, in the present invention, the vibration mode of a piezoelectric element defining a vibrating member is not restricted.

Figure 24:
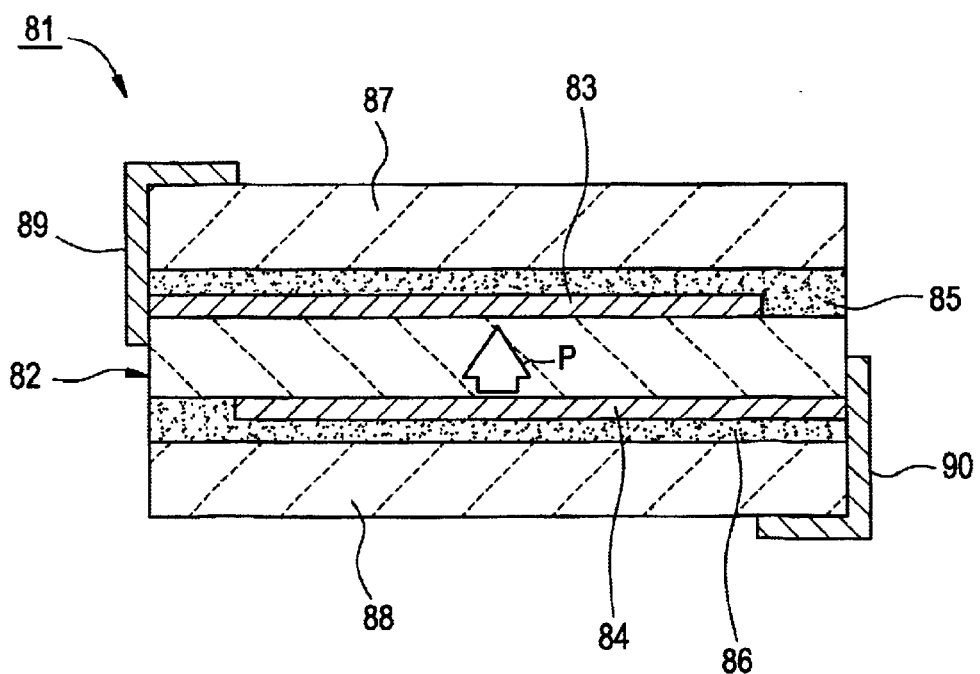
FIG. 24 shows a schematic section illustrating a piezoelectric resonator using a thickness longitudinal vibration mode as a modified example of the vibration device according to the present invention.

FIG. 24 shows a schematic section illustrating a modified example of the vibration device according to the present invention. A piezoelectric resonator 81 shown in FIG. 24 includes a piezoelectric element 82 using a thickness longitudinal vibration mode. The piezoelectric element 82 preferably has a substantially rectangular plate shape. On the top and bottom surfaces of the piezoelectric element 82, exciting electrodes 83 and 84 are provided, which are opposed to each other via the piezoelectric element 82. In addition, on the top and bottom surfaces of the piezoelectric element 82, ceramic plates 87 and 88 defining supporting members are provided via reflecting layers 85 and 86. Furthermore, terminal electrodes 89 and 90 are provided on the external surfaces of the piezoelectric resonator 81 and are electrically connected to the exciting electrodes 83 and 84.

Similar to the piezoelectric element 82, a piezoelectric element using a thickness longitudinal vibration mode may be used as a vibrating member used in the present invention. Additionally, similar to the piezoelectric resonator 81, the reflecting layers 83 and 84 and the supporting members 87 and 88 may be stacked at the top and bottom of the piezoelectric element 82.

Figure 25:
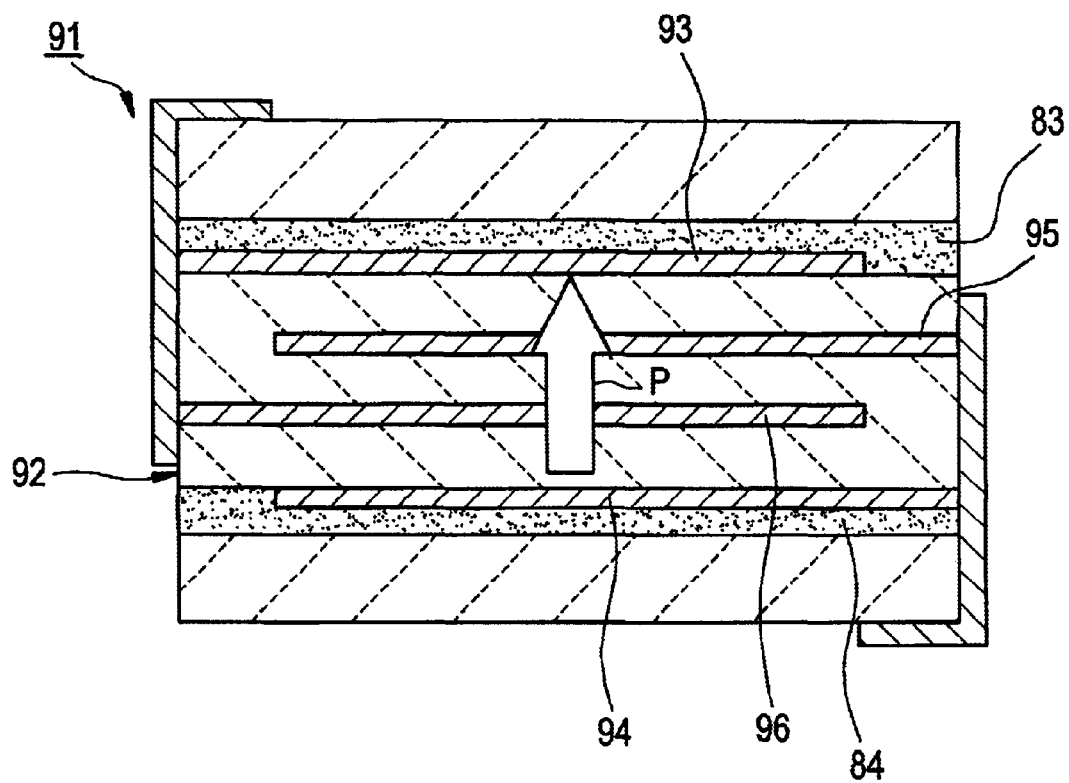
FIG. 25 shows a schematic section illustrating a multilayer piezoelectric resonator using a thickness longitudinal vibration mode as another modified example of the vibration device according to preferred embodiments of the present invention.

Furthermore, similar to the piezoelectric resonator 91 shown in FIG. 25, the present invention can also be applied to a multi-layer piezoelectric resonator using a thickness longitudinal vibration mode. Here, in addition to exciting electrodes 93 and 94, a piezoelectric element 92 includes internal electrodes 95 and 96 provided therein. With this arrangement, the piezoelectric element 92 using a harmonic of a thickness longitudinal vibration mode is produced. On the top and bottom of the piezoelectric element 92, similar to the piezoelectric resonator 81, the reflecting layers 83 and 84 and the supporting members 87 and 88 are stacked.

In addition, in the vibration device according to preferred embodiments of the present invention, when the symbol A represents the direction of vibration displacement of a vibrating member, symbol B represents the direction of vibrations propagating through the vibrating member, and symbol C represents the direction of vibrations propagating through the reflecting layers, combinations among the directions A, B, and C can be changed according to the necessary condition.

Figure 26A:
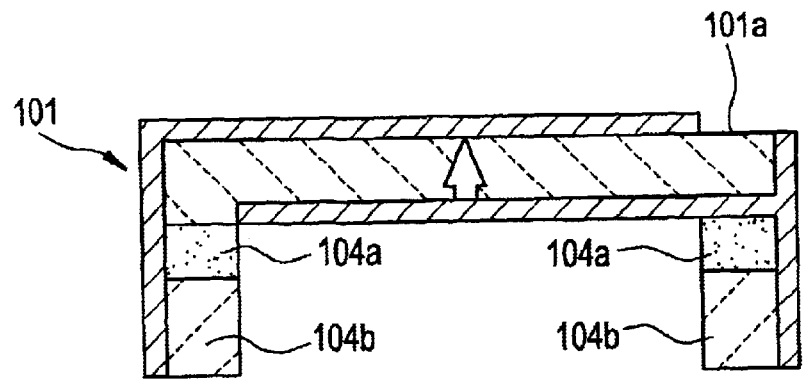
FIGS. 26A to 26C schematically illustrate the sections of modified examples of a piezoelectric resonator using a length mode according to preferred embodiments of the present invention.
Figure 26B:
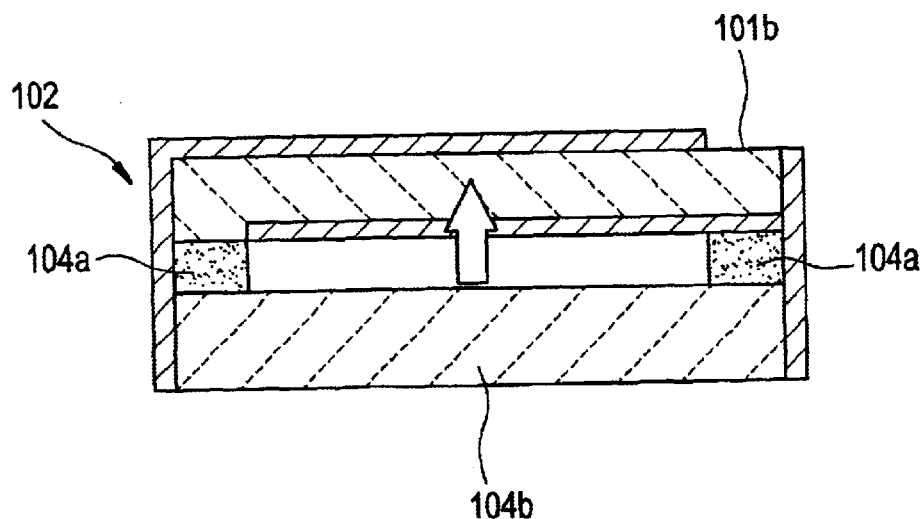
Figure 26C:
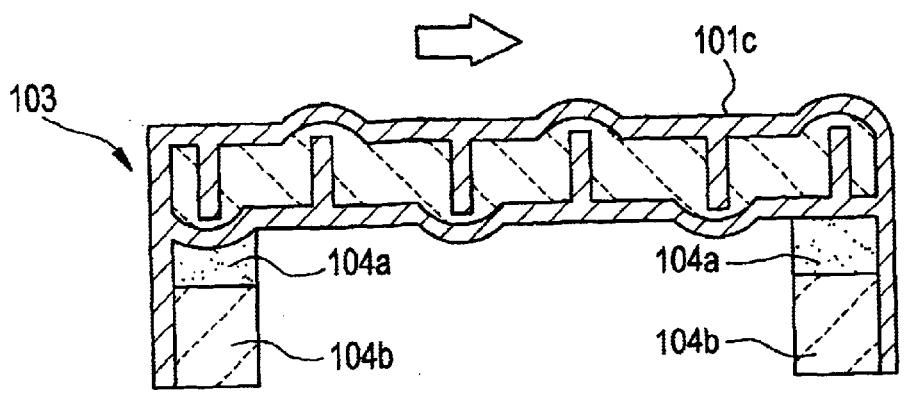

For example, like piezoelectric resonators 101 to 103 shown in FIGS. 26A to 26C, the direction A may be arranged substantially parallel to the direction B and the direction B may be arranged substantially perpendicular to the direction C. The piezoelectric resonators 101 to 103 shown in FIGS. 26A to 26C are preferably piezoelectric resonators using length vibration modes and piezoelectric elements 101a, 101b, and 101c are polarized in directions indicated by arrows in the figures. Additionally, the reference numeral 104a denotes a reflecting layer and the reference numeral 104b denotes a supporting member.

In the piezoelectric resonators 101 to 103 shown in FIGS. 26A to 26C, the bottom surfaces of the piezoelectric elements 101a to 101c are connected to the reflecting layers. When the area of each bottom surface is $S_1$, where the reflecting layers 104a and 104b are connected to the piezoelectric elements 101a to 101c, the area $S_2$ of the portion where each layer is in contact with each piezoelectric element is preferably smaller than $S_1$.

Figure 27:
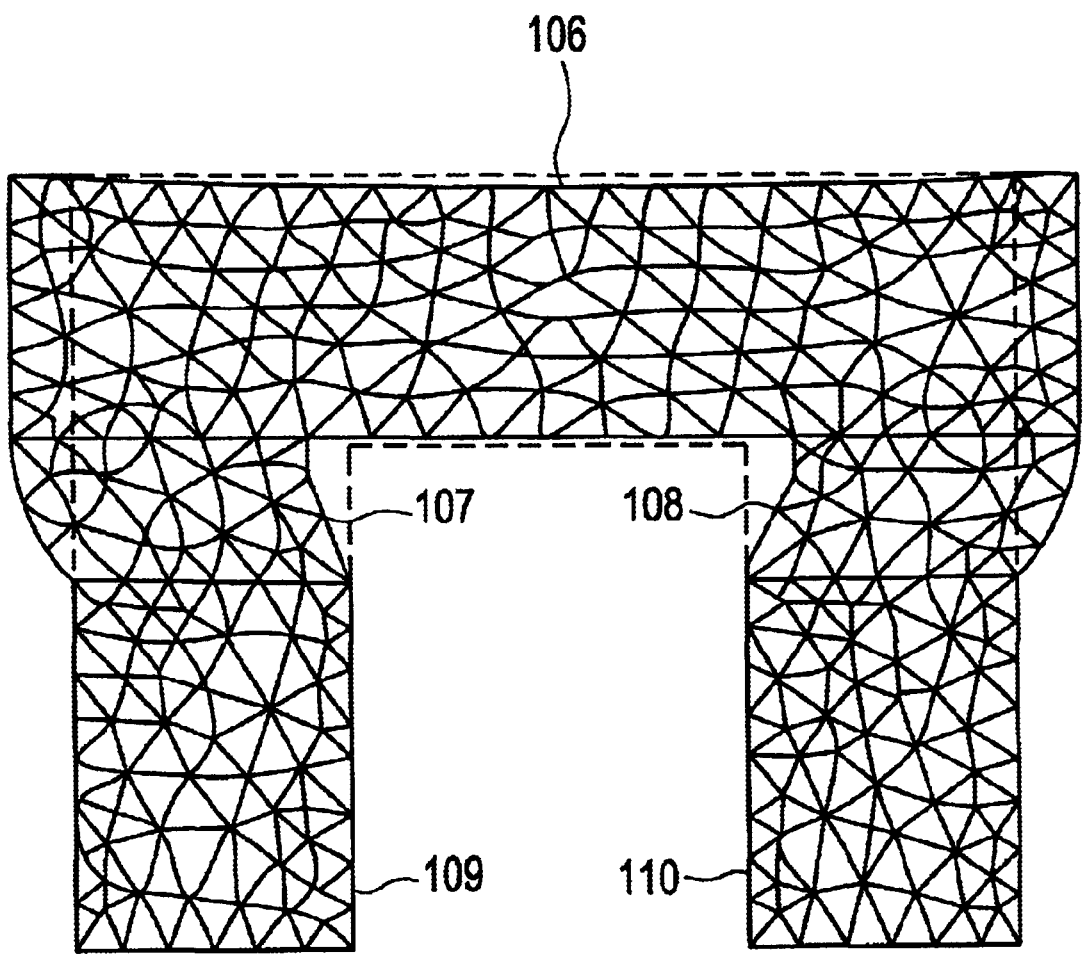
FIG. 27 illustrates the displacement distribution of a piezoelectric resonator obtained from an analysis by a finite element method in a structure in which reflecting layers are arranged substantially perpendicularly to a direction in which the vibration of a piezoelectric element using a length mode propagates.

In addition, in this invention, reflecting layers may be arranged substantially perpendicularly to the direction of vibrations propagating through a vibrating member. FIG. 27 shows the displacement distribution of a resonator obtained from an analysis by a finite element method. In FIG. 27, as a vibrating member, a piezoelectric element 106 is provided and is made of a piezoelectric ceramic having an acoustical impedance $Z_1$ of about $3.0 \times 10^7$ kg/(m²·s) and using a length mode in which the length $L_1$ thereof is about 0.98 mm, and the resonant frequency is about 2 MHz. On side surfaces of the piezoelectric element 106, reflecting layers 107 and 108 are provided in a direction that is substantially perpendicular to a direction in which vibrations propagate through the piezoelectric element 106. The area $S_1$ of each side surface of the piezoelectric element 106 is about 0.294 mm². Each of the reflecting layers 107 and 108 has an acoustical impedance $Z_2$ of about $1.87 \times 10^6$ kg/(m²·s) and a thickness of about 0.15 mm. The thickness thereof is equivalent to the length from the interfaces between the piezoelectric element 106 and the reflecting layers 107 and 108 to the opposite sides of the reflecting layers 107 and 108. Additionally, the area $S_2$ of the portion where each of the reflecting layers 107 and 108 is connected to the piezoelectric element 106 is about 0.084 mm². Each of supporting members 109 and 110 is made of a piezoelectric ceramic such as lead zirconate titanate having an acoustical impedance $Z_3$ of about $3.0 \times 10^7$ kg/(m²·s) and are connected to the reflecting layers 107 and 108.

As shown in FIG. 27, in a piezoelectric resonator 105, similarly, vibrations do not propagate to supporting members 109 and 110.

Thus, in the vibration device according to preferred embodiments of the present invention, the reflecting layers may be connected in the direction that is substantially perpendicular to the direction in which vibrations propagate through the vibrating member. The example for this will be embodied by the above-mentioned piezoelectric resonators 101 to 103 shown in FIGS. 26A to 26C.

Figure 28A:
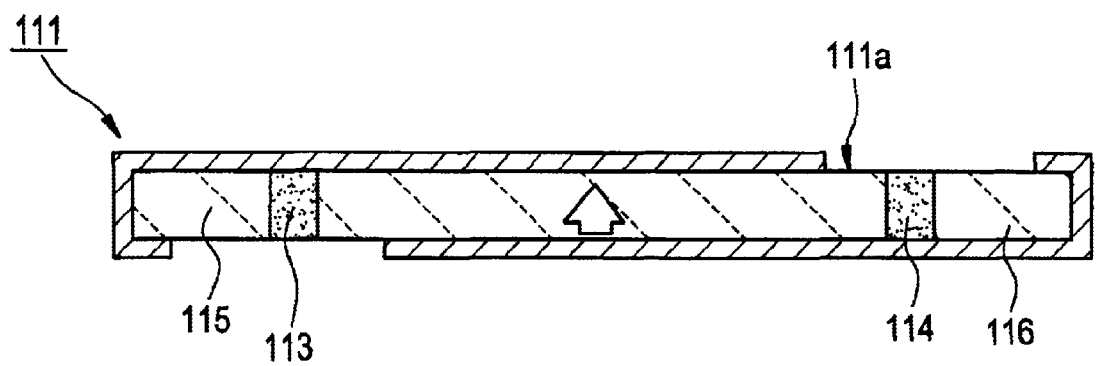
FIGS. 28A and 28B show schematic sections of modified examples of a piezoelectric resonator in which reflecting layers and supporting members are connected to each side of a piezoelectric element using a thickness longitudinal vibration mode.
Figure 28B:
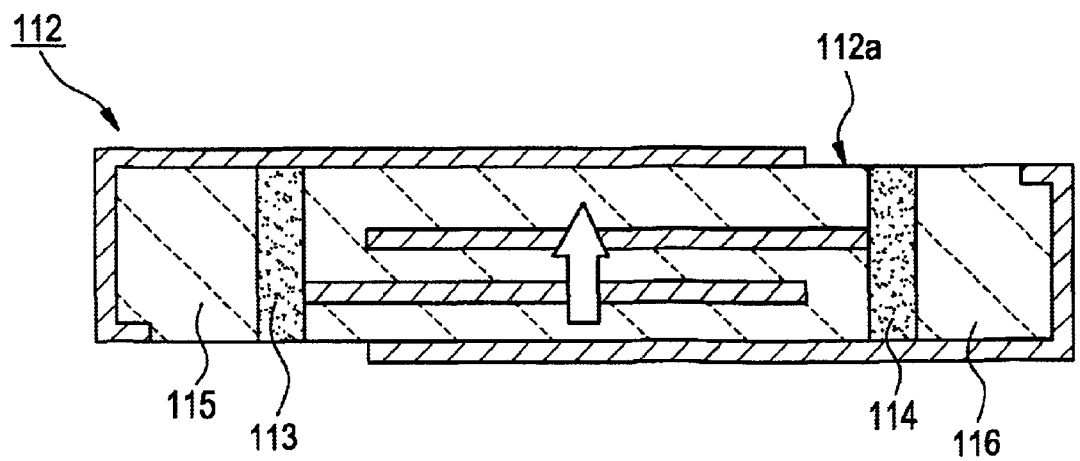

Furthermore, as in piezoelectric resonators 111 and 112 schematically shown in FIGS. 28A and 28B, each of reflecting layers 113 and 114 may be arranged in a direction that is substantially perpendicular to the direction of vibrations propagating through piezoelectric elements 111a and 112a using a thickness longitudinal vibration mode, that is, in a direction that is substantially parallel to a polarizing direction indicated by each arrow in the figures. The piezoelectric element 112a shown in FIG. 28B, which includes internal electrodes, is a multi-layer piezoelectric resonant element using a thickness longitudinal vibration mode.

In FIGS. 28A and 28B, on each side of each of the piezoelectric elements 111a and 112a, the reflecting layers 113 and 114 are arranged in the direction that is substantially perpendicular to the direction of vibrations propagating through the piezoelectric elements 111a and 112a. In addition, supporting members 115 and 116 are connected to end surfaces opposed to the end surfaces of the reflecting layers 113 and 114 connected to the piezoelectric elements 111a and 112a.

Figure 29:
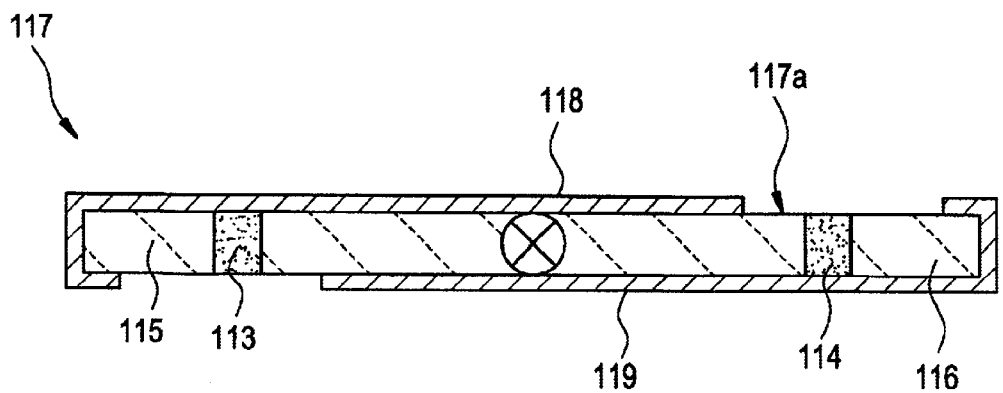
FIG. 29 shows a schematic section of a piezoelectric resonator as another modified example of the vibration device according to preferred embodiments of the present invention, which includes a piezoelectric element using a thickness torsional mode as a vibrating member.

In addition, in the vibration device according to preferred embodiments of the present invention, as in a piezoelectric resonator 117 shown in FIG. 29, the direction of vibration displacement of a vibrating member may be substantially perpendicular to the direction of vibrations propagating through the vibrating member, and the direction of vibrations propagating through the vibrating member may be substantially parallel to the direction of vibrations propagating through the reflecting layers. The piezoelectric resonator 117 includes a piezoelectric element 117a. In the piezoelectric element 117a, each of exciting electrodes 118 and 119 is provided on each main surface made of a piezoelectric ceramic member and is polarized in a direction penetrating from the front surface of the paper to the back surface thereof in FIG. 29. Thus, the piezoelectric element 117a uses a thickness torsional vibration mode. Reflecting layers 113 and 114 and supporting members 115 and 116 are connected to the outside of the piezoelectric element 117a.

As shown in FIGS. 26 to 29, and in FIGS. 31A to 31C which will be described below, in preferred embodiments of the present invention, the relative positions among the direction of vibration displacement of the vibrating member, the direction of vibrations propagating through the vibrating member, and the direction of vibrations propagating through the reflecting layers can be configured in various manners. In any case, within the range in which the above-mentioned acoustical impedances $Z_1$, $Z_2$, and $Z_3$ satisfy the above-specified conditions, similar to the first preferred embodiment, the supporting members mechanically support the piezoelectric resonator without significantly influencing on the resonant characteristics of the piezoelectric element.

Figure 30:
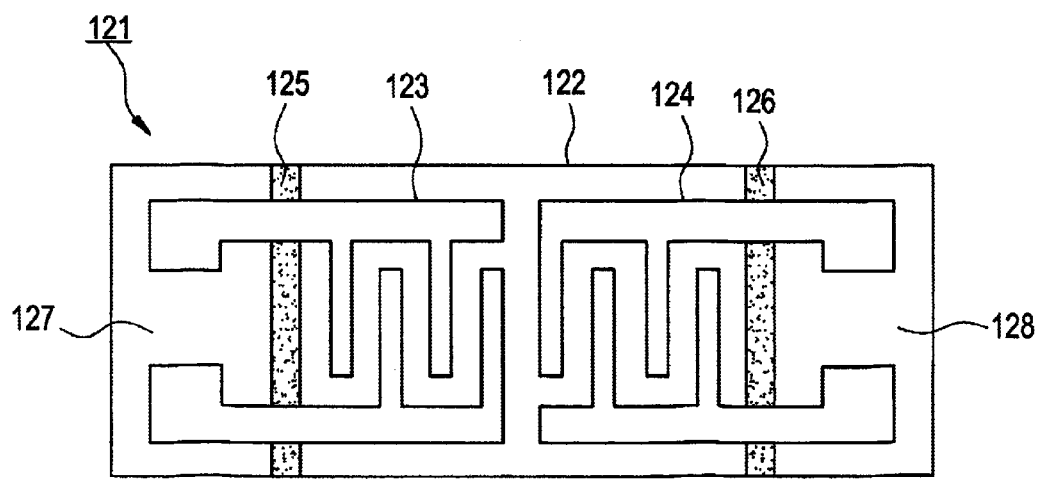
FIG. 30 shows a plan view illustrating a surface acoustic wave resonator as another modified example of the vibration device according to preferred embodiments of the present invention.

In addition, the present invention can be applied to other types of resonators and filters using piezoelectric effects, such as surface acoustic wave devices. FIG. 30 shows a plan view of a surface acoustic wave resonator defining a vibration device according to a fourth preferred embodiment of the present invention. In a surface acoustic wave resonator 121, first and second interdigital transducers (IDT) 123 and 124 are arranged on a piezoelectric substrate 122 having a substantially rectangular plate shape at a desired gap in a direction in which a surface acoustic wave propagates. First- and second reflecting layers 125 and 126 are connected to the outside of the piezoelectric plate 122 in the surface-acoustic-wave propagating direction, and supporting members 127 and 128 defined by ceramic plates are connected to the outside of the reflecting layers 125 and 126. In this preferred embodiment, the acoustical impedance $Z_1$ of the piezoelectric plate 122, the acoustical impedance $Z_2$ of each of the reflecting layers 125 and 126, and the acoustical impedance $Z_3$ of the supporting members 127 and 128 are set in the same manner as the first preferred embodiment. Additionally, the area ratio $S_2/S_1$ is approximately equal to 1. Thus, a surface acoustic wave is reflected at the interfaces between the supporting members 127 and 128 and the reflecting layers 125 and 126 to act as a surface acoustic wave resonator. Accordingly, since a reflector is not needed, the size of the surface acoustic wave resonator is greatly reduced.

Figure 31A:
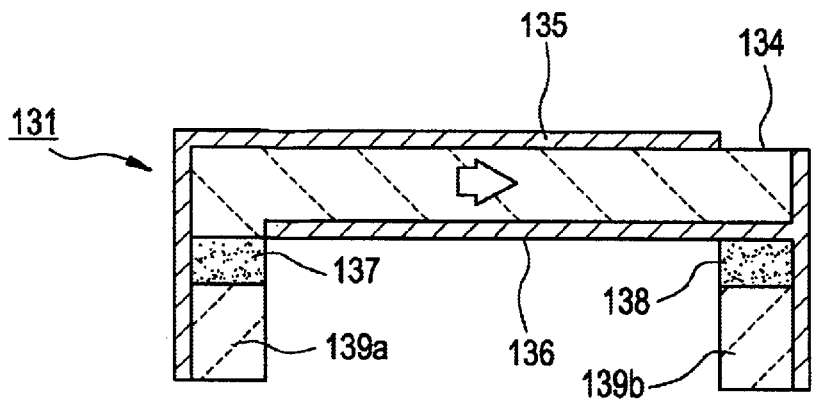
FIGS. 31A to 31C show schematic sections illustrating piezoelectric resonators using a thickness-shear mode as other modified examples of the vibration device according to preferred embodiments of the present invention.
Figure 31B:
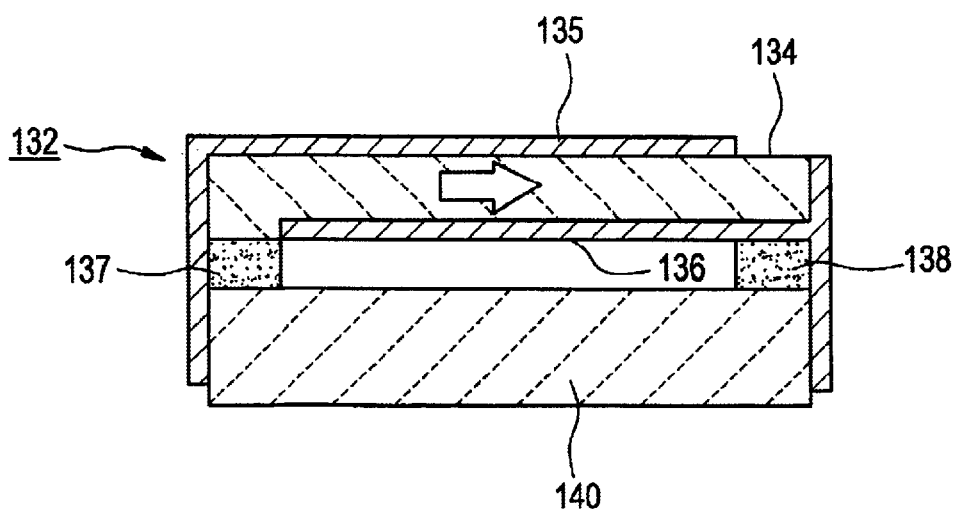
Figure 31C:
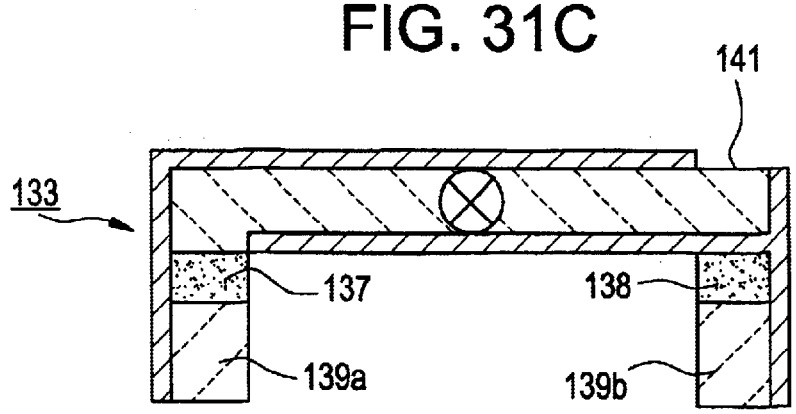

FIGS. 31A to 31C show schematic sections illustrating piezoelectric resonators 131 to 133. In these resonators, the direction A of vibration displacement of a vibrating member, the direction B of vibrations propagating through the vibrating member, and the vibration C of propagating through reflecting layers are substantially perpendicular to each other.

The piezoelectric resonator 131 includes a piezoelectric element 134 using a thickness-shear mode. The piezoelectric element 134, which is polarized in a direction indicated by an arrow shown in the figure, includes exciting electrodes 135 and 136. The direction A of vibration displacement includes components both substantially parallel and substantially perpendicular to the exciting electrodes. The direction B of vibrations propagating through the piezoelectric element 134 is substantially parallel to the exciting electrodes 135 and 136. In contrast, the reflecting layers 137 and 138 are connected to the bottom surface of the piezoelectric element 134 and the direction C of vibrations propagating through each of the reflecting layers 137 and 138 is substantially perpendicular to the direction B of vibrations propagating through the piezoelectric element 134. Supporting members 139a and 139b are connected to the surfaces of the reflecting layers 137 and 138 opposing the surfaces of the reflecting layers 137 and 138 connected to the piezoelectric element 134.

In FIG. 31B, a supporting member 140 is provided. The supporting member 140 is equivalent to a configuration in which the supporting members 139a and 139b are integrally combined.

As shown in the figure, the supporting member connected to the outer side surface of the reflection layer is connected to both of the first and second reflecting layers.

The piezoelectric resonator 133 shown in FIG. 31C uses a piezoelectric element 141 using a thickness torsional vibration. In other portions, the remainder of the structure thereof is preferably the same as the structure of the piezoelectric resonator 1 shown in FIG. 31A.

As described above, in the vibrating device according to preferred embodiments of the present invention, the vibrating member may be defined by piezoelectric elements using various vibration modes. As an alternative to such a piezoelectric element, an electrostriction-effect element may be used. In addition, the vibrating member used in the present invention is not restricted to an electromechanical coupling conversion element such as a piezoelectric element and an electrostrictive element. Vibration sources producing various vibrations may also be used.

In addition, in various preferred embodiments of the present invention, the connections among the vibrating member, the reflecting layers, and the supporting members are not restricted to those shown in the above-described preferred embodiments and the modified examples. For example, as shown in FIGS. 32A to 32C and FIG. 33, a vibration device having a plurality of vibrating members may be provided.

Figure 32A:
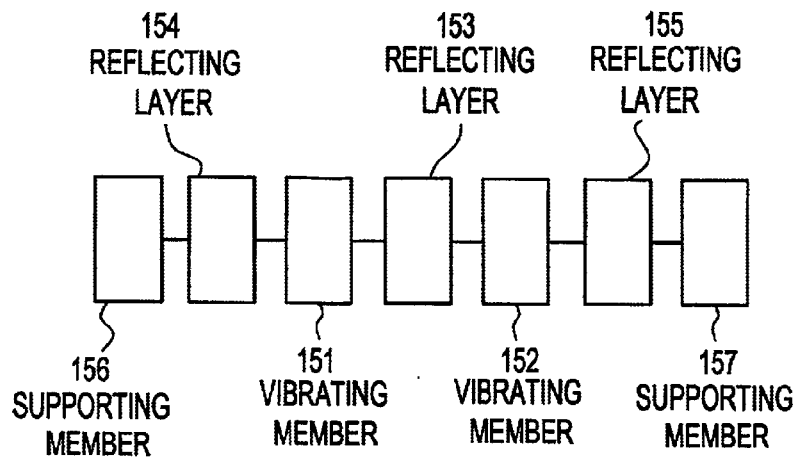
FIGS. 32A to 32C show schematic block diagrams illustrating modified examples of the vibration device according to preferred embodiments of the present invention, each of which has first and second vibrating members.

In the vibration device shown in FIG. 32A, first and second vibrating members 151 and 152 are mutually connected via reflecting layer 153. Reflecting layers 154 and 155 and supporting members 156 and 157 are connected to the outer side surfaces of the first and second vibrating members 151 and 152. In this case, the reflecting layers 155 and 156 are equivalent to the first and second reflecting layers of the present invention, and the supporting members 156 and 157 are equivalent to the first and second supporting members of the invention. In addition, the vibrating members 151 and 152 connected to each other via the reflecting layer 153 can be regarded as a vibrating member included in the vibration device according to preferred embodiments of the present invention. Also, since the first and second vibrating members 151 and 152 are connected via the reflecting layer 153, vibrations propagated from the first vibrating member to the reflecting layer 153 are reflected at the interface between the reflecting layer 153 and the second vibrating member 152. In contrast, vibrations propagated from the second vibrating member 152 to the reflecting layer 153 are reflected at the interface between the reflecting layer 153 and the first vibrating member 151.

Figure 32B:
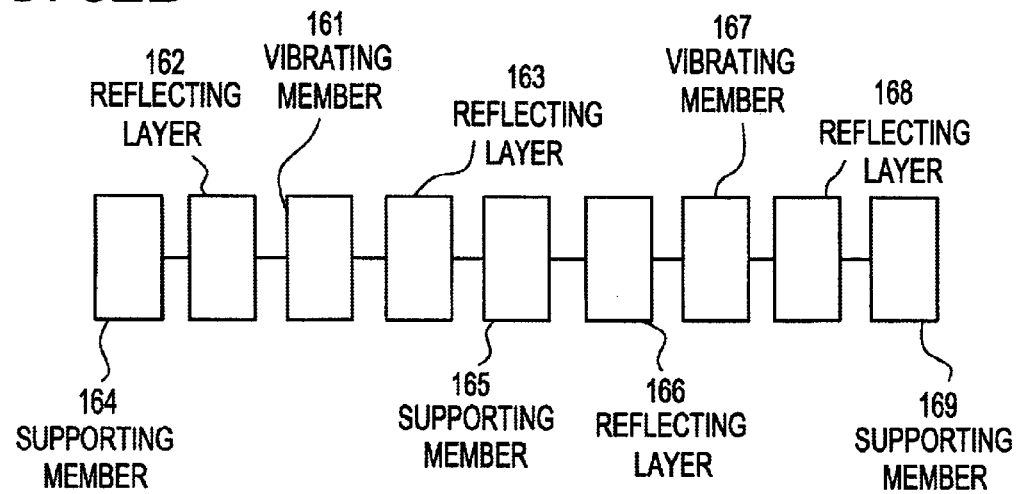

In the vibration device shown in FIG. 32B, first and second reflecting layers 162 and 163 are connected to each side of a vibrating member 161 and supporting members 164 and 165 are connected to the outer side surfaces of the first and second reflecting layers 162 and 163. In other words, these arrangements are the same as those in the first preferred embodiment. However, unlike the first preferred embodiment, in this vibration device, a third reflecting layer 166, a second vibrating member 167, a fourth reflecting layer 168, and a third supporting member 169 are connected, in this order, to the outer side of the second supporting member 165. In this case, vibrations produced by the second vibrating member 167 is reflected at the interfaces between the reflecting layers 166 and 168 and the supporting members 165 and 169. In other words, two vibration devices according to the first preferred embodiment are provided and a supporting member is arranged as one of the supporting members of the two vibration devices such that the two vibration devices are combined.

Figure 32C:
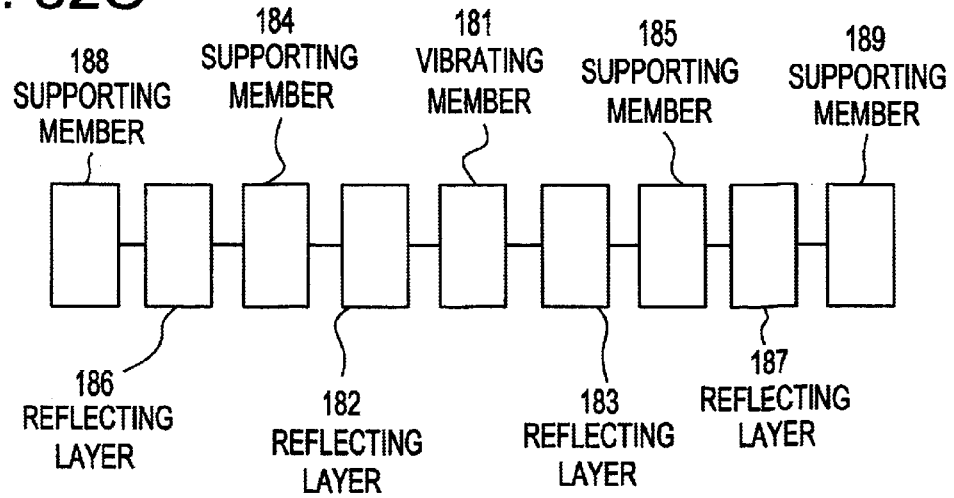

Furthermore, as shown in FIG. 32C, after reflecting layers 182 and 183 and supporting members 184 and 185 are connected to each side of a vibrating member 181, reflecting layers 186 and 187 and supporting members 188 and 189 may additionally be connected to the outer side of each of the supporting members 184 and 185.

Figure 33:
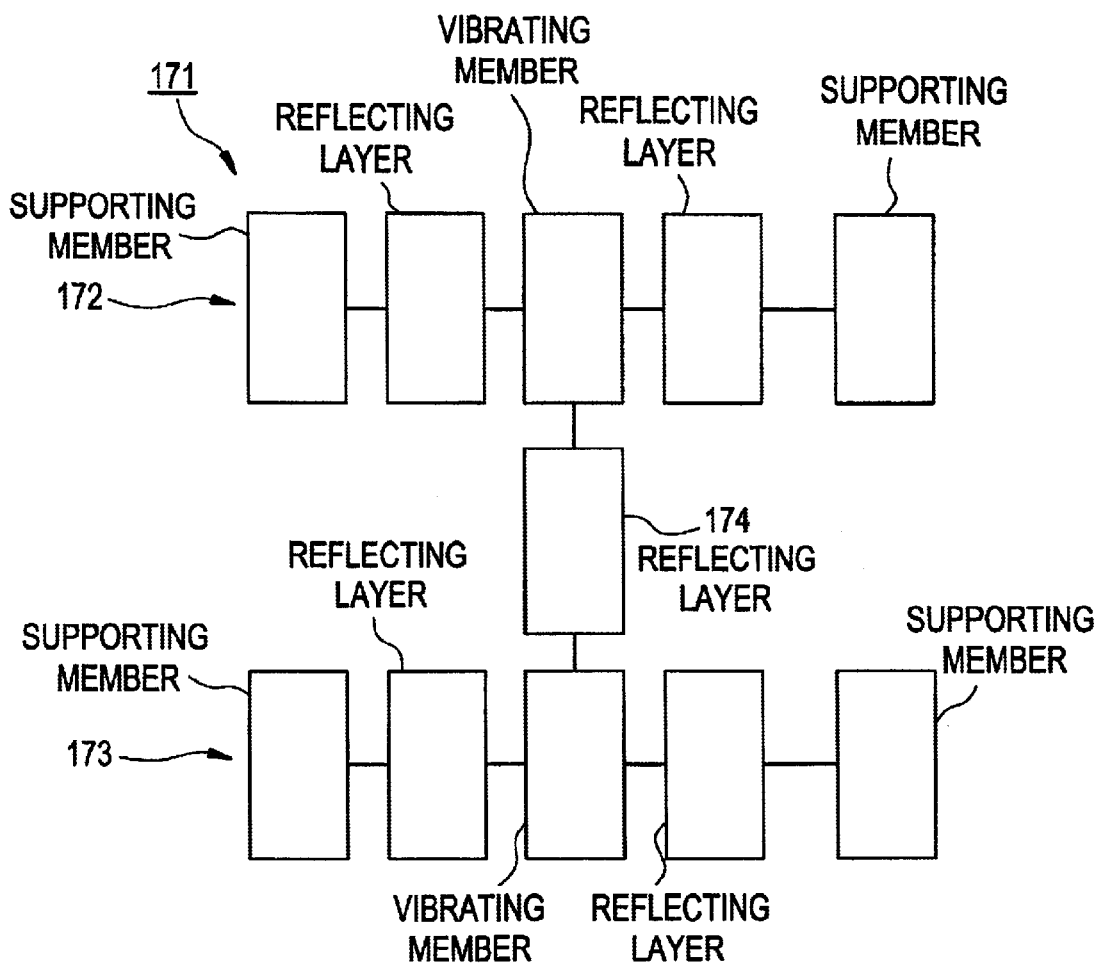
FIG. 33 shows a schematic block diagram illustrating another modified example of the vibration device according to preferred embodiments of the present invention, which has first and second vibrating members.

In a vibration device 171 shown in FIG. 33, vibration devices 172 and 173 similar to the first preferred embodiment are connected to each other via a reflecting layer 174.

Figure 36:
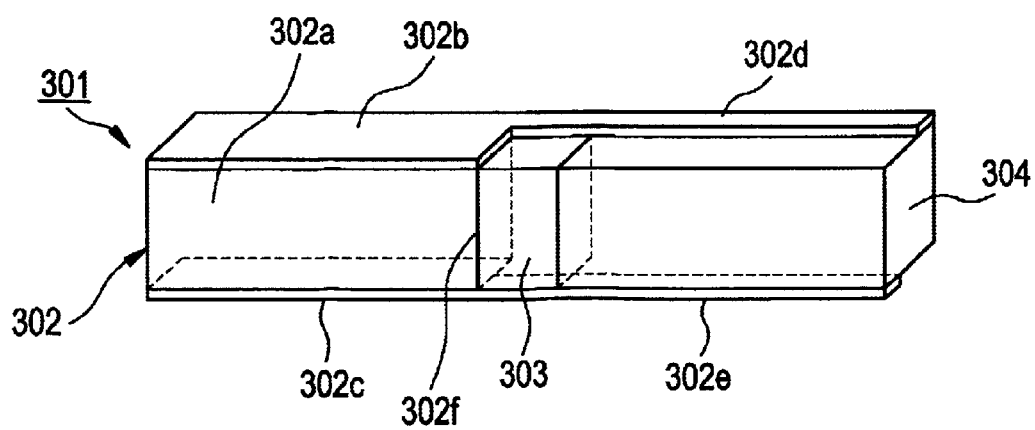
FIG. 36 is a perspective view of a preferred embodiment of the vibrating device according to the present invention.

FIG. 36 is a perspective view showing a piezoelectric resonator using the thickness shear mode as a composite vibration device according to another preferred embodiment of the present invention.

A piezoelectric resonator 301 includes a piezoelectric element 302 using the thickness shear mode as a vibration member, a reflecting layer 303 connected to one end of the piezoelectric element 302, a supporting member 304 connected to the outside of the reflecting layer 303.

The piezoelectric element 302 includes a piezoelectric body 302a. The piezoelectric body 302a has a strip-like shape, and is polarized in the length direction. Exciting electrodes 302b and 302c are provided on upper and lower surfaces of the piezoelectric body 302a. The piezoelectric element 302 resonates in the thickness shear mode by applying the AC voltage between the exciting electrodes 302b and 302c.

Lead-out electrodes 302d and 302e are provided such that they extend to upper and lower surfaces of the reflecting layer 303 and the supporting member 304.

According to this preferred embodiment, when the area of the end surface 302f of the piezoelectric element 302 connected with the reflecting layer 303 is represented by $S_1$, and the contacting area of the reflecting layer 303 connected with the piezoelectric element 302 is represented by 52, the value of $S_2/S_1$ is preferably about 1. Particularly, the horizontal sectional shape of the piezoelectric element 302 is substantially the same as the surface of the reflecting layer 303 connected with the piezoelectric element 302, and the reflecting layer 303 is parallel to the horizontal section of the piezoelectric element. Here, the piezoelectric element 302 includes lead titanate ceramics, and the acoustical impedance $Z_1$ thereof is about $3.4 \times 10^7$ kg/(m²·S).

On the other hand, the reflecting layer 303 includes epoxy resin whose acoustical impedance is about $1.87 \times 10^6$ kg/(m²·S). Further, the supporting member 304 includes a ceramic whose acoustical impedance is about $3.4 \times 10^7$ kg/(m²·S).

In the piezoelectric resonator 301 of the present invention, the length of the piezoelectric element 302, that is, a dimension along the polarization direction, is about 0.75 mm. The resonant frequency is about 4.0 MHz. The thickness of the reflecting layer 303, that is, a dimension along the length direction of the piezoelectric element 302, is about 0.08 mm. The length of the supporting member 304 is about 0.04 mm. The result of the displacement distribution analyzed by a finite element method is shown in FIG. 37.

Figure 37:
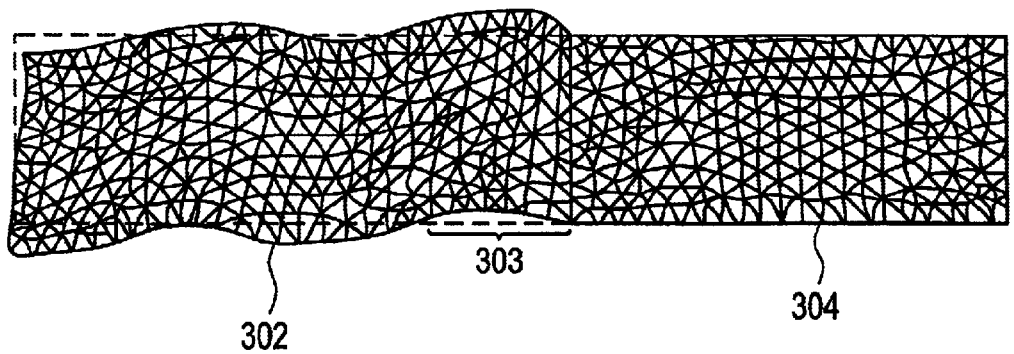
FIG. 37 is a schematic vertical sectional view showing the displacement distribution of the vibrating device of FIG. 36 obtained from an analysis by a finite element method.

As clearly shown in FIG. 37, the displacement is not generated in the supporting member 304. Thus, the piezoelectric resonator 301 is supported by the supporting member 304 without influencing the resonant characteristics of the piezoelectric element 302. Namely, as in the preferred embodiment shown in FIG. 1, since the vibration transmitted from the piezoelectric element 302 is reflected at the reflecting layer 303, the vibration is not transmitted to the supporting member.

According to the present invention, the reflecting layer and the supporting member may be provided only at one side of the vibrating member.

Figure 38:
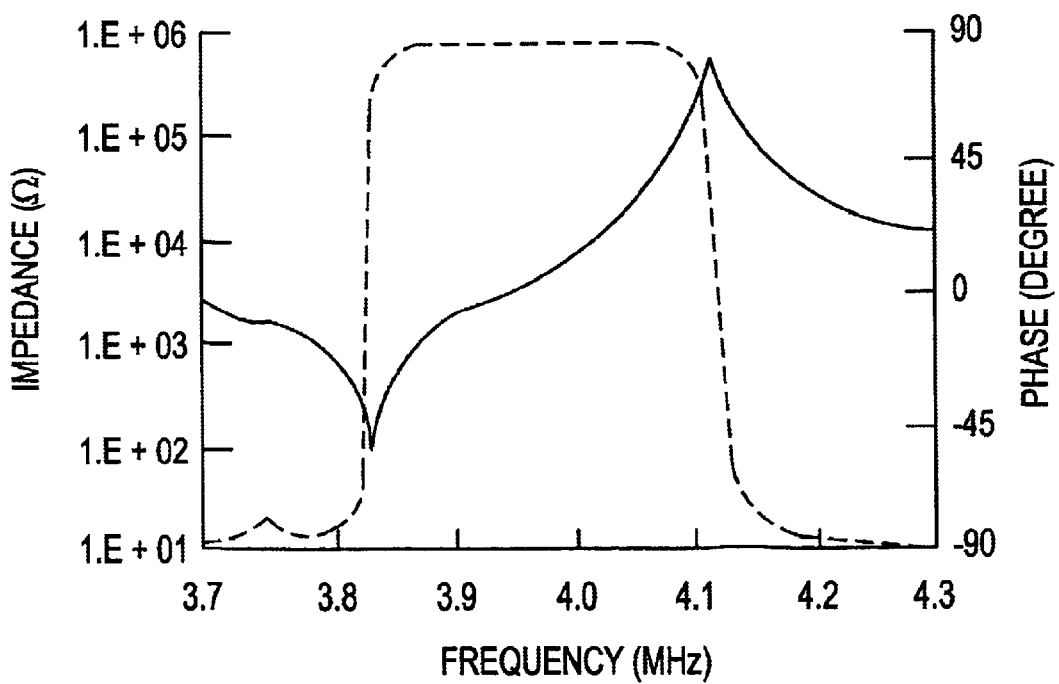
FIG. 38 is a view showing the impedance-frequency characteristics and the phase-frequency characteristics of the piezoelectric resonator of FIG. 36.

FIG. 38 shows the impedance-frequency characteristics and the phase-frequency characteristics of the piezoelectric resonator constructed as described above. Note that the solid line shows the impedance-frequency characteristics and the broken line shows the phase-frequency characteristics.

Note that 1.E+0n of the vertical axis in FIG. 38 means $1 \times 10^n$. For example, 1.E+02 means $1 \times 10^2$.

Figure 39:
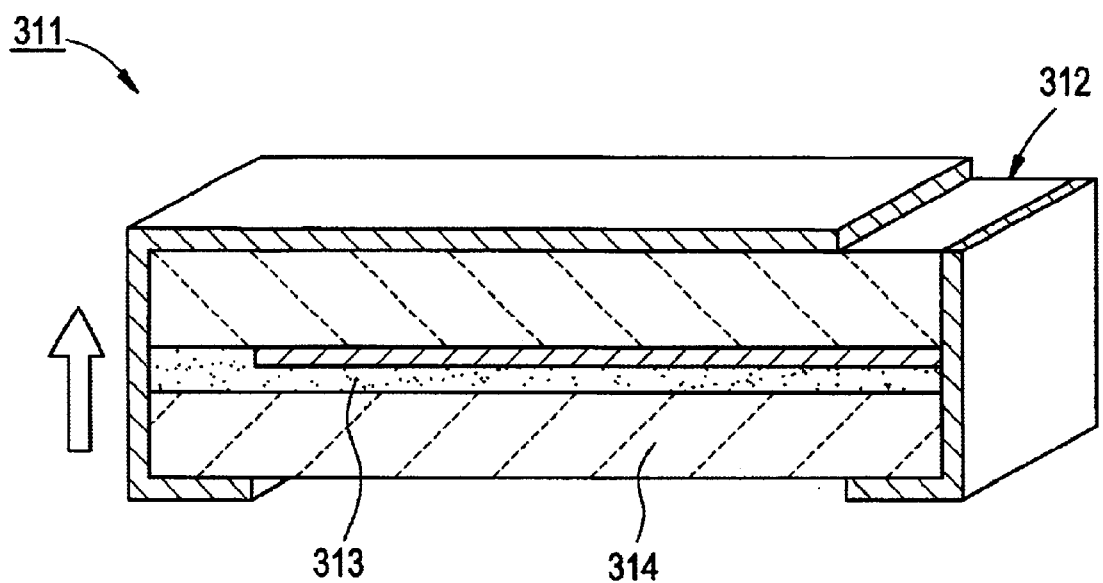
FIG. 39 is a perspective view of a piezoelectric resonator of the thickness longitudinal vibration mode as another modified example of the present invention.

In the piezoelectric resonator 301, the piezoelectric element 302 using the thickness shear mode is provided. However, as shown in FIG. 39, a piezoelectric element 312 using the thickness expansion mode can be provided. In the piezoelectric resonator 311 shown in FIG. 39, the reflecting layer 313 is provided on a lower surface of the piezoelectric element 312 using the thickness expansion mode. The supporting member 314 is provided on a lower surface of the reflecting layer 313.

As shown, where the reflecting layer and the supporting member are provided only on one side of the vibrating member, the thickness of the device is reduced as compared with the device in which the reflecting layer and the supporting member are provided on both sides thereof.

FIGS. 40 to 45 show modified examples in which the reflecting layer and the supporting member are provided only on one side of the vibrating member as in the case of FIG. 36.

According to FIG. 37A, the reflecting layer 323 and the supporting member 324 are provided on one end side in the longitudinal direction of the piezoelectric element 322 using the length mode. In this way, the device can be provided for a piezoelectric element 322 of the length mode.

Figure 40A:
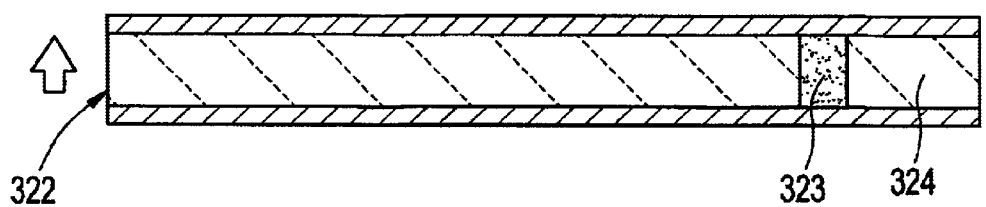
FIG. 40A and FIG. 40B are vertical sectional views of another modified example of the vibrating device according to the present invention.
Figure 40B:
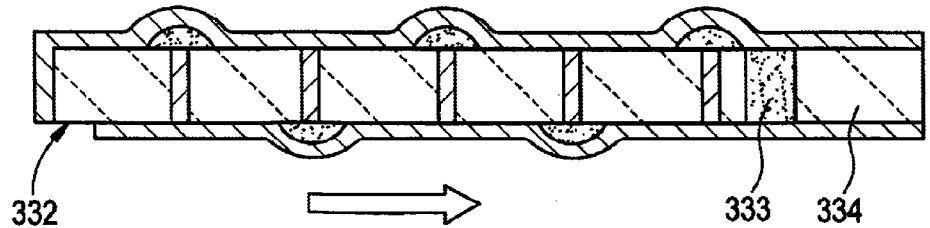

FIG. 40B shows a laminated piezoelectric element 332 using the length mode. Namely, the reflecting layer 333 and the supporting member 334 are provided at one end in the longitudinal direction of the piezoelectric element 332. In other words, the piezoelectric resonator 331 shown in FIG. 40B corresponds to a structure in which one side of the reflecting layer and the supporting member are removed from the piezoelectric resonator 31 shown in FIG. 16.

Figure 41A:
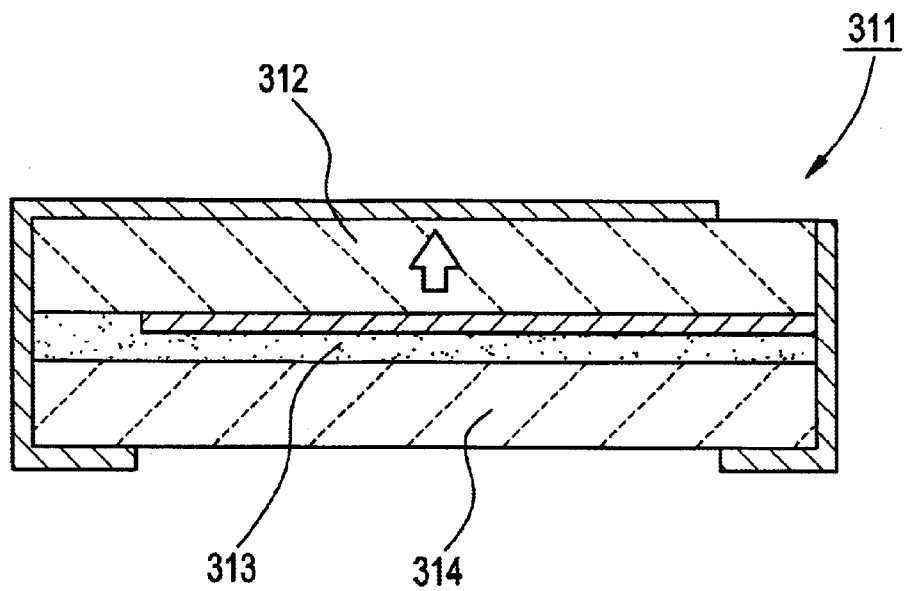
FIG. 41A and FIG. 41B are front sectional views of still another modified example of the vibrating device according to the present invention.
Figure 41B:
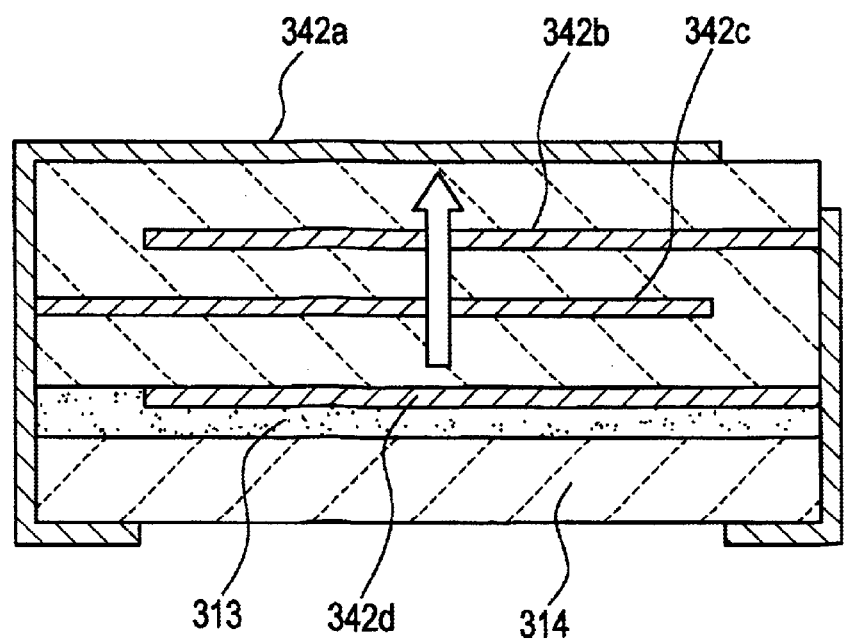

FIG. 41B shows an example in which the piezoelectric resonators shown in FIG. 39 and FIG. 41A are modified to a laminated piezoelectric resonator using the thickness expansion mode. And a plurality of exciting electrodes 342a to 342d are disposed such that they are laminated with a ceramic layer provided therebetween to define a laminated piezoelectric element 332 using the thickness expandsion mode.

According to FIGS. 40A to 41B, the vibration displacement direction of the piezoelectric element defining a vibrating portion, the vibration transmitting direction in the piezoelectric element, and the vibration transmitting direction in the reflecting layer are parallel to one another.

Next, FIG. 42 and FIG. 43 show modified examples in which the vibration displacement direction of the vibrating portion and the vibration transmitting direction in the vibrating portion is parallel, but these directions are perpendicular to the vibration transmitting direction in the reflecting layer.

Figure 42A:
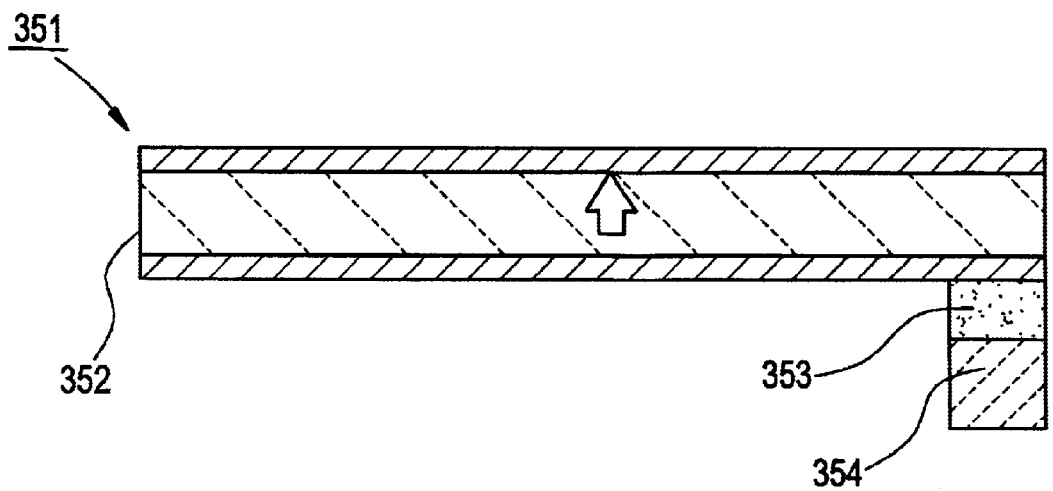
FIG. 42A and FIG. 42B are vertically sectional views showing still another modified example of the vibrating device according to the present invention.

In a piezoelectric resonator 351 shown in FIG. 42A, a piezoelectric element 352 using the length mode is provided.

At one side of the piezoelectric element 352, a reflecting layer 353 is connected to a lower surface of the piezoelectric element 352 and a supporting member 354 is connected to the lower surface of the reflecting layer 353. In this example, even if the vibration displacement direction and the vibration transmitting direction in the piezoelectric element 352 are perpendicular to the vibration transmitting direction in the reflecting layer, the vibration to the supporting member 354 is suppressed by reflecting the vibration at the reflecting layer 353.

Figure 42B:
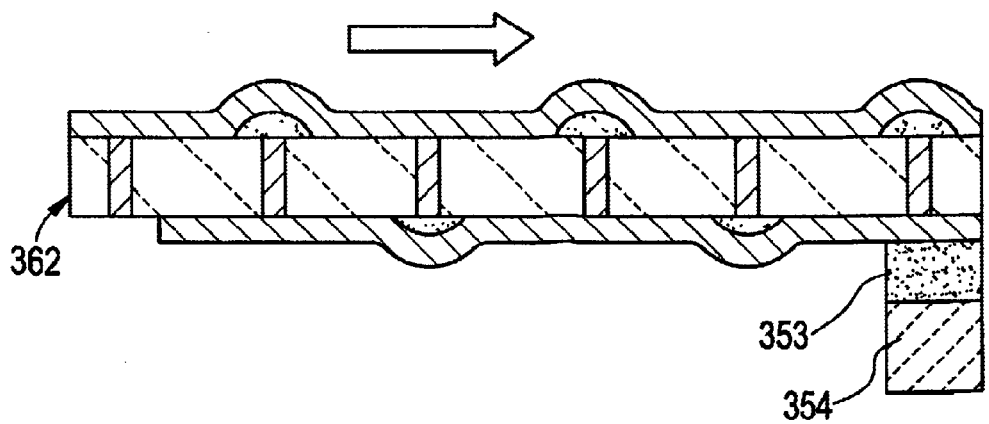

FIG. 42B shows a piezoelectric resonator in which a laminated piezoelectric element 362 using the length mode is provided. Other features of the laminated piezoelectric element 362 are the same as the piezoelectric resonator 351.

Figure 43A:
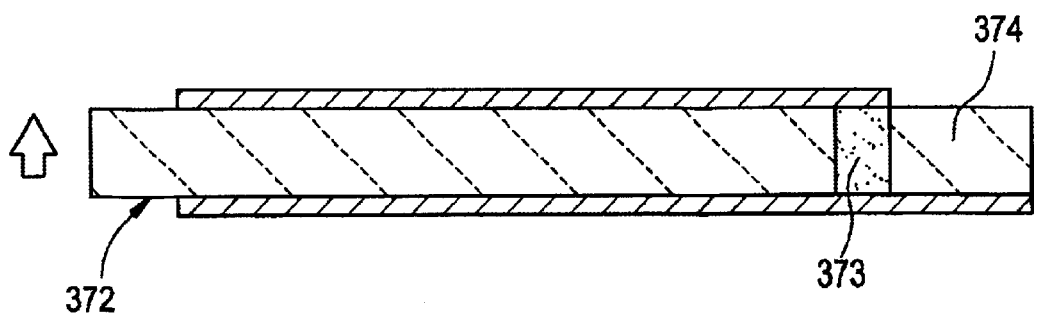
FIG. 43A and FIG. 43B are front sectional views showing a further modified example of the vibrating device according to the present invention.
Figure 43B:
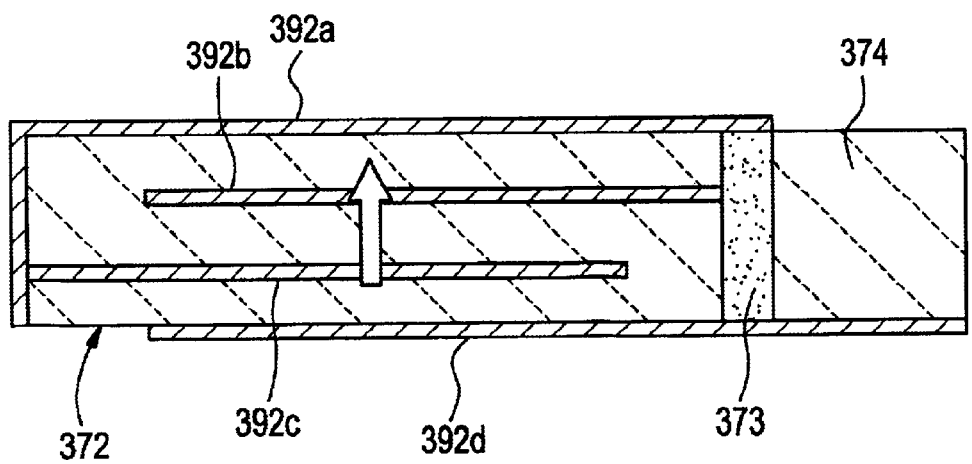

In a piezoelectric resonator 371 shown in FIG. 43A, a reflecting layer 373 and a supporting member 374 are connected at one side of the piezoelectric element 372 using the thickness expandsion mode. In this case also, the vibration to the supporting member 374 is suppressed by reflecting the vibration transmitted from the piezoelectric element 372 by the reflecting layer 373. Further, as shown in FIG. 43B, a piezoelectric element using the thickness expansion mode is a laminated piezoelectric element 392 having a plurality of exciting electrodes 392a to 392d.

Next, FIG. 44 shows a modified preferred embodiment in which the vibration transmitting direction in the vibration portion is perpendicular to the vibration displacement direction of the vibration member, and the vibration transmitting direction in the vibration member is parallel to the vibration transmitting direction in the reflector.

Figure 44A:
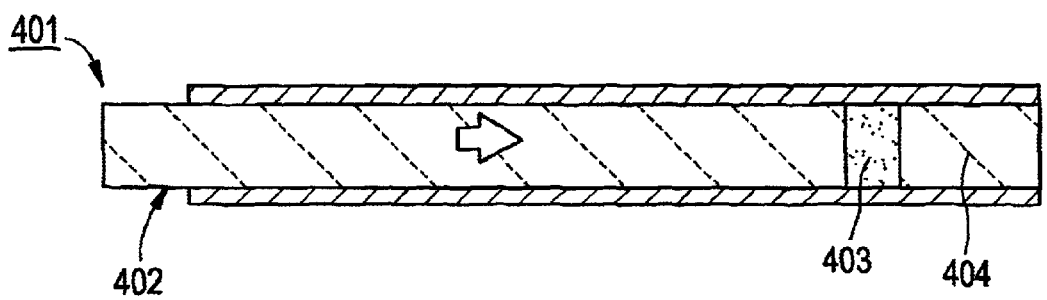
FIG. 44a and FIG. 44B are vertically sectional views showing another modified example of the vibrating device according to the present invention.
Figure 44B:
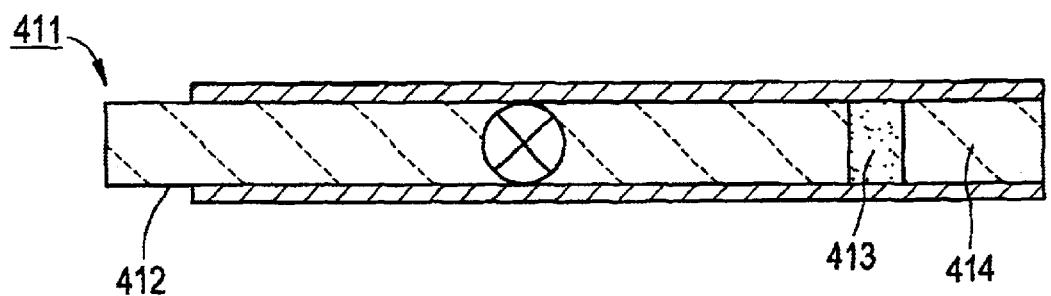

According to a piezoelectric resonator 401 in FIG. 44A, a reflecting layer 403 and a supporting member 404 are connected to one end in a longitudinal direction of a piezoelectric element 402 using the thickness shear mode. And according to a piezoelectric resonator 411 in FIG. 44B, a reflecting layer 413 and a supporting member 414 are connected to one end in a longitudinal direction of a piezoelectric element 412 using the thickness twisted mode.

Further, the vibration displacement direction of the vibrating member may be perpendicular to the vibration transmitting direction of the vibrating member, and the vibration transmitting direction in the vibrating member is perpendicular to the vibration transmitting direction in the reflector. As an example of such a case, piezoelectric resonators 421 and 431 are shown in FIGS. 42A and 45B, respectively.

According to the piezoelectric resonator 421, at a lower surface of the piezoelectric resonator 422 using the thickness shear mode, a reflecting layer 423 is connected to one end side in the longitudinal direction of the resonator 422 and a supporting member 424 is connected to a lower surface of the reflecting layer 423. According to the piezoelectric resonator 431 of FIG. 45B, at a lower surface of a piezoelectric element 432, a reflecting layer 433 and a supporting member 434 are laminated near one end side of the resonator 431 using the thickness twisted mode.

Figure 45A:
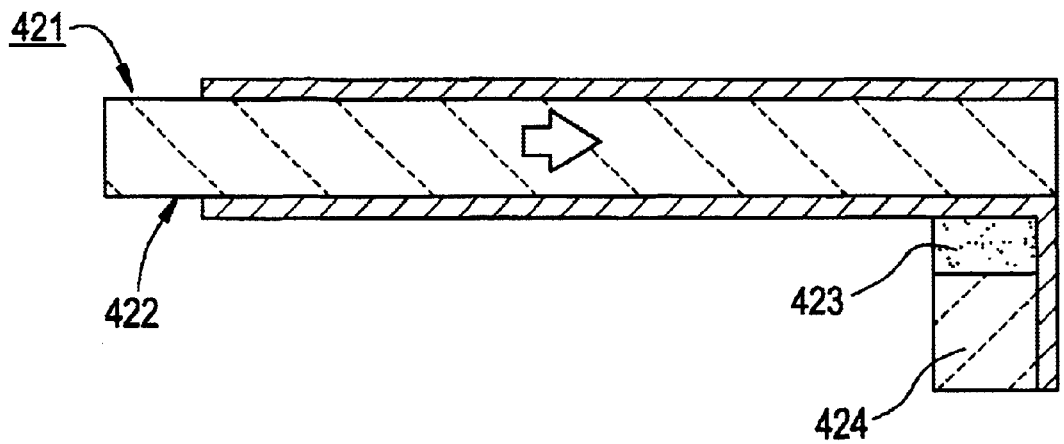
FIG. 45A and FIG. 45B are front sectional views showing still further another modified example of the vibrating device according to the present invention.
Figure 45B:
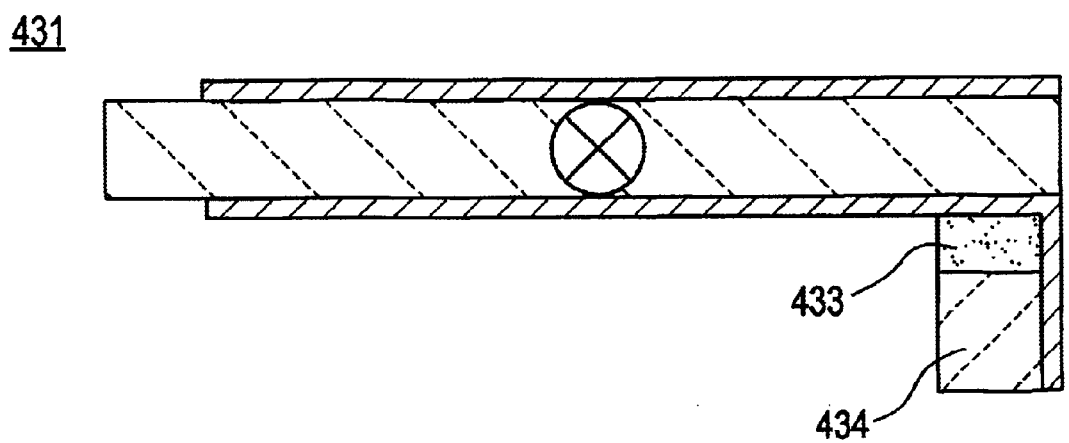

As shown in FIGS. 45A and 45B, even if the vibration displacement direction of the vibrating member is perpendicular to the vibration transmitting direction in the vibration member, and vibration transmitting direction in the vibration member is perpendicular to the vibration transmitting direction in the reflecting layer, as the case shown in FIG. 36, the piezoelectric resonator can be more mechanically supported by the supporting member without influencing the resonant characteristics of the piezoelectric resonator because of the existence of the reflecting layer.

As described above, in the composite vibration device according to preferred embodiments of the present invention, on each side of the vibration-producing source, the first and second reflecting layers are connected. To the sides opposed to the sides where the first and second reflecting layers are connected to the vibrating member, the first and second supporting members are connected. In addition, the acoustical impedance $Z_2$ of each reflecting layer is preferably lower than the acoustical impedance $Z_1$ of the vibrating member and the acoustical impedance $Z_3$ of the supporting members. Thus, vibrations propagated from the vibrating member to the reflecting layers are reflected at the interfaces between the reflecting layers and the supporting members. As a result, the first and second supporting members mechanically support the vibration device without significantly influencing the vibration characteristics of the vibrating member.

In various preferred embodiments of the present invention, the reflecting layers and the supporting members are connected to the vibrating member in the manner described above. With this arrangement, vibrations propagated to the reflecting layers are reflected at the interfaces between the reflecting layers and the supporting members. Thus, in the present invention, there are no restrictions on the vibration mode of the vibrating member and the structural details of the device. For example, when using a piezoelectric vibrating element as the vibrating member, a variety of vibration modes can be used, such as a length vibration mode, a bending vibration mode, and an extension vibration mode. Accordingly, in the vibration device of preferred embodiments of the present invention, the vibrating member can utilize vibration modes that cannot be utilized in conventional energy-trap piezoelectric vibrating elements. Thus, the vibration device of various preferred embodiments of the present invention is supported with a simple structure, without using a spring terminal.

In addition, although the conventional energy-trap piezoelectric resonators using a thickness-shear mode must have a vibration attenuating section, which requires a relatively large space, the vibration device of preferred embodiments of the present invention does not need such a vibration attenuating section. Thus, when using a vibration mode, the present invention provides a piezoelectric resonator, a piezoelectric filter, and other vibrating device which is much smaller than conventional energy-trap-type piezoelectric vibrating elements.

Furthermore, in the present invention, when the acoustical impedance ratio $Z_2/Z_1$ is about 0.2 or less, the vibration device is supported by the supporting members without substantially influencing the vibration characteristics of the vibrating member. Similarly, when the acoustical impedance ratio $Z_2/Z_3$ is about 0.2 or less, the supporting members mechanically support the vibration device without substantially influencing the vibration characteristics of the vibrating member.

On the sides of the first and second supporting members opposite to the sides thereof connected to the first and second reflecting layers, the third reflecting layer, the second vibrating member, the fourth reflecting layer, and the third supporting member are connected in this order. With this arrangement, the present invention provides a filter using the two vibrating members. Furthermore, when the first supporting member, the first reflecting layer, the first vibrating member, the second reflecting layer, the second vibrating member, the third reflecting layer, and the second supporting member are connected in this order to define a composite vibration device, according to preferred embodiments of the present invention, the vibration device can be mechanically supported by the first and second supporting members without significantly influencing the vibration characteristics of the first and second vibrating members. Thus, the present invention provides a compact piezoelectric filter and a compact composite piezoelectric resonant device using a variety of vibration modes.

In various preferred embodiments of the present invention, when the distances from the interfaces between the reflecting layers and the vibrating member to the interfaces between the reflecting layers and the supporting members are in an approximate range of $n \cdot \lambda/4 \pm \lambda/8$, where $\lambda$ represents the wavelength of propagated vibration, the vibration characteristics of the vibrating member when the supporting members mechanically support the vibration device are not significantly influenced.

In the vibration device according to preferred embodiments of the present invention, the first and second reflecting layers are connected on each side of the vibration-producing source. In addition, the first and second supporting members are connected to the sides of the first and second reflecting layers opposite to the sides thereof connected to the vibrating members. The acoustical impedance $Z_2$ of each of the reflecting layers is lower than the acoustical impedance $Z_1$ of each vibrating member and the acoustical impedance $Z_3$ of each supporting member. The area ratio $S_2/S_1$ is preferably about 1 or less. As a result, vibrations propagated from the vibrating members to the reflecting layers are reflected at the interfaces between the reflecting layers and the supporting members almost without fail. Thus, the vibration device is mechanically supported by the first and second supporting members without significantly influencing the vibration characteristics of the vibrating member.

According to another aspect of the present invention, the acoustical impedance $Z_2$ of the reflecting layer is lower than the acoustical impedance $Z_1$ of the vibrating member and the acoustical impedance $Z_3$ of the supporting member. The area ratio $S_2/S_1$ is preferably about 1 or less. As a result, the vibration propagated from the vibrating member to the reflecting layer is effectively reflected at the interface between the reflecting layer and the supporting member. Thus, the vibration device is mechanically supported by the supporting member without significantly influencing the vibration characteristics of the vibrating member. In this case, the reflecting layer and the supporting member are provided on only one side of the vibrating members, thereby reducing the size of the vibrating device.

Additionally, in various preferred embodiments of the present invention, the reflecting layers and the supporting members are connected to the vibrating member as described above to reflect vibrations propagated to the reflecting layers at the interfaces between the reflecting layers and the supporting members. Thus, there is no restriction on the vibration mode of the vibrating member and the structural details of the device. As a result, for example, when using a piezoelectric vibrating element to define a vibrating member, a variety of vibration modes can be used, such as a length vibration mode, a bending vibration mode, and an extension vibration mode, as well as other suitable modes. Accordingly, preferred embodiments of the present invention can use vibration modes that are not suitable for conventional energy-trap piezoelectric vibrating elements to produce a composite vibration device that can be supported by the simple structure that does not require a spring terminal.

In addition, in a conventional energy-trap piezoelectric resonator using a thickness-shear mode, a vibration attenuating section must be provided which requires a relatively large space. In contrast, the vibration device of preferred embodiments of the present invention does not require such a vibration attenuating section. Thus, when using a vibration mode, the present invention provides a piezoelectric resonator and a piezoelectric filter that is much smaller than conventional energy-trap type piezoelectric vibration devices.

When the acoustical impedance ratio $Z_2/Z_1$ is about 0.2 or less, the vibration device is supported by the supporting members without significantly affecting the vibration characteristics of the vibrating member. Similarly, when the acoustical impedance ratio $Z_2/Z_3$ is about 0.2 or less, the supporting members mechanically support the device without substantially influencing the vibration characteristics of the vibrating member.

On the sides of the first and second supporting members opposite to the sides thereof connected to the first and second reflecting layers, the third reflecting layer, the second vibrating member, the fourth reflecting layer, and the third supporting member are connected in this order. With this arrangement, the present invention provides a filter including the two vibrating members. Furthermore, when the first supporting member, the first reflecting layer, the first vibrating member, the second reflecting layer, the second vibrating member, the third reflecting layer, and the second supporting member are connected in this order to define a composite vibration device, according to the present invention, the device is mechanically supported by the first and second supporting members without significantly influencing the vibration characteristics of the first and second vibrating members. Thus, various preferred embodiments of the present invention provides a compact piezoelectric filter and a compact composite piezoelectric resonant device using a variety of vibration modes.

In various preferred embodiments of the present invention, when the distances from the interfaces between the reflecting layers and the vibrating member to the interfaces between the reflecting layers and the supporting members are in an approximate range of $n·\lambda/4±\lambda/8$, where $\lambda$ represents the wavelength of propagated vibrations, the influence on the vibration characteristics of the vibrating member when the supporting members mechanically support the vibration device is greatly reduced.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A composite vibration device comprising:
   a vibrating member defining a vibration producing source, the vibrating member being comprised of a material having a first acoustical impedance $Z_1$;
   first and second reflecting layers connected to respective sides of the vibrating member, each of the first and second reflecting layers being comprised of a material having a second acoustical impedance $Z_2$ which is lower than the first acoustical impedance $Z_1$; and
   first and second supporting members, each of which is comprised of a material having a third acoustical impedance $Z_3$ which is higher than the second acoustical impedance $Z_2$, the first and second supporting members being connected to sides of the first and second reflecting layers opposing the sides of the reflecting layers connected to the vibrating member, respectively;
   wherein vibrations propagated from the vibrating member to the reflecting layers are reflected at the interfaces between the reflecting layers and the supporting members.

2. The composite vibration device according to claim 1, wherein the ratio $Z_2/Z_1$ of the second acoustical impedance $Z_2$ with respect to the first acoustical impedance $Z_1$ is about 0.2 or less.

3. The composite vibration device according to claim 1, wherein the ratio $Z_2/Z_3$ of the second acoustical impedance $Z_2$ with respect to the third acoustical impedance $Z_3$ is about 0.2 or less.

4. The composite vibration device according claim 1, wherein the vibrating member is an electromechanical coupling conversion element.

5. The composite vibration device according to claim 4, wherein the electromechanical coupling conversion element is a piezoelectric element.

6. The composite vibration device according to claim 4, wherein the electromechanical coupling conversion element is an electrostrictive element.

7. The composite vibration device according to claim 1, further comprising a third reflecting layer, a second vibrating member, a fourth reflecting layer, and a third supporting member, which are connected, in this order, to a side of at least one of the first and second supporting members opposing the side thereof connected to at least one of the first and second reflecting layers.

8. The composite vibration device according to claim 1, wherein the reflecting layers are defined by a stack of a plurality of layers comprised of materials having different acoustical impedances.

9. The composite vibration device according to claim 1, wherein when the wavelength of the vibrations produced by only one vibrating member is represented by the symbol $\lambda$, the distances from the interfaces between the reflecting layers and the vibrating member to the interfaces between the reflecting layers and the supporting members are in a range of $n·\lambda/4±\lambda/8$, in which the symbol n represents an odd number.

10. The composite vibration device according to claim 1, wherein when a symbol A represents a direction of vibration displacement of the vibrating member, a symbol B represents a direction of vibrations propagating through the vibrating member, and a symbol C represents a direction of vibrations propagating through each reflecting layer, the directions A, B, and C are substantially parallel to each other.

11. The composite vibration device according to claim 1, wherein when a symbol A represents a direction of vibration displacement of the vibrating member, a symbol B represents a direction of vibrations propagating through the vibrating member, and a symbol C represents a direction of vibrations propagating through each reflecting layer, the directions A and B are substantially parallel and the directions B and C are substantially perpendicular to each other.

12. The composite vibration device according to claim 1, wherein when a symbol A represents a direction of vibration displacement of the vibrating member, a symbol B represents a direction of vibrations propagating through the vibrating member, and a symbol C represents a direction of vibrations propagating through each reflecting layer, the directions A and B are substantially perpendicular and the directions B and C are substantially parallel.

13. The composite vibration device according to claim 1, wherein when a symbol A represents a direction of vibration displacement of the vibrating member, a symbol B represents a direction of vibrations propagating through the vibrating member, and a symbol C represents a direction of vibrations propagating through each reflecting layer, the directions A and B are substantially parallel and also the directions B and C are substantially parallel.

14. A composite vibration device comprising:
- first and second vibrating members defining vibrating producing sources, each of the vibrating members being comprised of a material having a first acoustical impedance $Z_1$;
- first, second and third reflecting layers, each of which is comprised of a material having a second acoustical impedance $Z_2$ which is lower than the first acoustical impedance $Z_1$; and
- first and second supporting members, each of which is comprised of a material having a third acoustical impedance $Z_3$ which is higher than the second acoustical impedance $Z_2$;
- wherein the first supporting member, the first reflecting layer, the first vibrating member, the second reflecting layer, the second vibrating member, the third reflecting layer, and the second supporting member are connected in this order, and vibrations produced by the first and second vibrating members are reflected at the interface between the first reflecting layer and the first supporting member, or at the interface between the third reflecting layer and the second supporting member, and at the interfaces between the second reflecting layer and the first or second vibrating member.

15. The composite vibration device according to claim 14, wherein the reflecting layers are defined by a stack of a plurality of layers comprised of materials having different acoustical impedances.

16. The composite vibration device according to claim 14, wherein when the wavelength of the vibrations produced by only one vibrating member is represented by the symbol $\lambda$, the distances from the interfaces between the reflecting layers and the vibrating member to the interfaces between the reflecting layers and the supporting members are in a range of $n \cdot \lambda/4 \pm \lambda/8$, in which the symbol n represents an odd number.

17. A composite vibration device comprising:
- a vibrating member defining a vibration producing source, the vibrating member being comprised of a material having a first acoustical impedance $Z_1$;
- first and second reflecting layers connected to respective sides of the vibrating member, each of the layers being comprised of a material having a second acoustical impedance $Z_2$ which is lower than the first acoustical impedance $Z_1$; and
- first and second supporting members, each of which is comprised of a material having a third acoustical impedance $Z_3$ which is higher than the second acoustical impedance $Z_2$, the supporting members being connected to sides of the reflecting layers opposing the sides thereof connected to the vibrating member;
- wherein when the symbol $S_1$ represents the area of a surface of the vibrating member connected to each of the first and second reflecting layers and the symbol $S_2$ represents the area of a surface of each of the first and second reflecting layers connected to the vibrating member, the area ratio $S_2/S_1$ is about 1 or less, and vibrations propagated from the vibrating member to each reflecting layer are reflected at the interfaces between the reflecting layers and the supporting members.

18. The composite vibration device according to claim 17, wherein the ratio $Z_2/Z_1$ of the second acoustical impedance $Z_2$ with respect to the first acoustical impedance $Z_1$ is about 0.2 or less.

19. The composite vibration device according to claim 17, wherein the ratio $Z_2/Z_3$ of the second acoustical impedance $Z_2$ with respect to the third acoustical impedance $Z_3$ is about 0.2 or less.

20. The composite vibration device according to claim 17, wherein the vibrating member is an electromechanical coupling conversion element.

21. The composite vibration device according to claim 20, wherein the electromechanical coupling conversion element is a piezoelectric element.

22. The composite vibration device according to claim 20, wherein the electromechanical coupling conversion element is an electrostrictive element.

23. The composite vibration device according to claim 17, further comprising a third reflecting layer, a second vibrating member, a fourth reflecting layer, and a third supporting member, which are connected, in this order, to a side of at least one of the first and second supporting members opposing the side thereof connected to at least one of the first and second reflecting layers.

24. The composite vibration device according to claim 17, wherein the reflecting layers are defined by a stack of a plurality of layers comprised of materials having different acoustical impedances.

25. The composite vibration device according to claim 17, wherein when the wavelength of the vibrations produced by only one vibrating member is represented by $\lambda$, the distances from the interfaces between the reflecting layers and the vibrating member to the interfaces between the reflecting layers and the supporting members are in a range of $n \cdot \lambda/4 \pm \lambda/8$, in which the symbol n represents an odd number.

26. The composite vibration device according to claim 17, wherein when a symbol A represents a direction of vibration displacement of the vibrating member, a symbol B represents a direction of vibrations propagating through the vibrating member, and a symbol C represents a direction of vibrations propagating through each reflecting layer, the directions A, B, and C are substantially parallel.

27. The composite vibration device according to claim 17, wherein when a symbol A represents a direction of vibration displacement of the vibrating member, a symbol B represents a direction of vibrations propagating through the vibrating member, and a symbol C represents a direction of vibrations propagating through each reflecting layer, the directions A and B are substantially parallel and the directions B and C are substantially parallel.

28. The composite vibration device according to claim 17, wherein when a symbol A represents a direction of vibration displacement of the vibrating member, a symbol B represents a direction of vibrations propagating through the vibrating member, and a symbol C represents a direction of vibrations propagating through each reflecting layer, the directions A and B are substantially parallel and the directions B and C are substantially parallel.

29. The composite vibration device according to claim 17, wherein when the symbol A represents the direction of vibration displacement of the vibrating member, the symbol B represents the direction of vibrations propagating through the vibrating member, and the symbol C represents the direction of vibrations propagating through each reflecting layer, the directions A and B are substantially perpendicular and also the directions B and C are substantially perpendicular.

30. A composite vibration device comprising: first and second vibrating members defining vibrating producing sources, each of the vibrating members being comprised of a material having a first acoustical impedance $Z_1$;
- first, second and third reflecting layers, each of which is comprised of a material having a second acoustical impedance $Z_2$ which is lower than the first acoustical impedance $Z_1$; and first and second supporting members, each of which is comprised of a material having a third acoustical impedance $Z_3$ which is higher than the second acoustical impedance $Z_2$;

wherein the first supporting member, the first reflecting layer, the first vibrating member, the second reflecting layer, the second vibrating member, the third reflecting layer, and the second supporting member are connected in this order, and when the symbol $S_1$ represents the area of a surface of the vibrating member connected to each reflecting layer and the symbol $S_2$ represents the area of a surface of each reflecting layer connected to the vibrating member, the area ratio $S_2/S_1$ is about 1 or less; and vibrations produced by the first and second vibrating members are reflected at the interface between the first reflecting layer and the first supporting member, or at the interface between the third reflecting layer and the second supporting member, and at the interfaces between the second reflecting layer and the first or second vibrating member.

31. The composite vibration device according to claim 30, wherein the reflecting layers are defined by a stack of a plurality of layers comprised of materials having different acoustical impedances.

32. The composite vibration device according to claim 30, wherein when the wavelength of the vibrations produced by only one vibrating member is represented by $\lambda$, the distances from the interfaces between the reflecting layers and the vibrating member to the interfaces between the reflecting layers and the supporting members are in a range of $n \cdot \lambda/4 \pm \lambda/8$, in which the symbol n represents an odd number.

33. A composite vibration device comprising:

a vibrating member defining a vibration producing source, the vibrating member being comprised of a material having a first acoustical impedance $Z_1$;

a reflecting layer connected to a side of the vibrating member, the reflecting layer being comprised of a material having a second acoustical impedance $Z_2$ which is lower than the first acoustical impedance $Z_1$; and a supporting member comprised of a material having a third acoustical impedance $Z_3$ which is higher than the second acoustical impedance $Z_2$, the support member being connected to the side of the reflecting layer opposing the side of the reflecting layer connected to the vibrating member;

wherein the vibration propagated from the vibrating member to the reflecting layer is reflected at the interface between the reflecting layer and the supporting member.

34. The composite vibration device according to claim 33, wherein the ratio $Z_2/Z_1$ of the second acoustical impedance $Z_2$ with respect to the first acoustical impedance $Z_1$ is about 0.2 or less.

35. The composite vibration device according to claim 33, wherein the ratio $Z_2/Z_3$ of the second acoustical impedance $Z_2$ with respect to the third acoustical impedance $Z_3$ is about 0.2 or less.

36. The composite vibration device according to claim 33, wherein the vibrating member is an electromechanical coupling conversion element.

37. The composite vibration device according to claim 33, wherein the reflecting layer is defined by a plurality of stacked layers comprised of materials having different acoustical impedances.

38. The composite vibration device according to claim 33, wherein when the symbol $S_1$ represents the area of a surface of the vibrating member connected to the reflecting layer and the symbol $S_2$ represents the area of a surface of the reflecting layer connected to the vibrating member, the area ratio $S_2/S_1$ is about 1 or less.

* * * * *